(12) United States Patent
Ferguson et al.

(10) Patent No.: US 6,202,181 B1
(45) Date of Patent: Mar. 13, 2001

(54) METHOD FOR DIAGNOSING BRIDGING FAULTS IN INTEGRATED CIRCUITS

(75) Inventors: F. Joel Ferguson; Tracy Larabee, both of Santa Cruz; Brian Chess, Palo Alto; David B. Lavo, Santa Cruz, all of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 08/962,711

(22) Filed: Nov. 3, 1997

Related U.S. Application Data

(60) Provisional application No. 60/030,280, filed on Nov. 4, 1996.

(51) Int. Cl.$^7$ ................................................. G01R 31/28
(52) U.S. Cl. ............................. 714/724; 714/25; 714/47; 714/732; 324/76.11
(58) Field of Search ..................................... 714/724, 732, 714/2, 25, 30, 31, 42, 46, 47, 819; 324/76.11, 158.1

(56) References Cited

U.S. PATENT DOCUMENTS 5,717,849 * 2/1998 Brady .......................... 714/5

OTHER PUBLICATIONS

Millman, S. et al., "Diagnosing CMOS Bridging Faults With Stuck–At Fault Dictionaries", Proceedings of the IEEE 1990 International Test Conference, pp. 860–870. Sep. 1990.

Chess et al., "Diagnosis of Realistic Bridging Faults With Single Stuck–At Information", Proceedings of the IEEE/ACM International Conference on Computer Aided Design, pp. 185–192, Nov. 5, 1995.

* cited by examiner

*Primary Examiner*—Emmanuel L. Moise
(74) *Attorney, Agent, or Firm*—John P. O'Banion

(57) ABSTRACT

A method for diagnosing bridging faults with inexpensively-obtained stuck-at signatures, in which only those faults determined to be realistic through inductive fault analysis are considered as candidates, match restrictions and match requirements are imposed during matching in order to minimize diagnosis size, and match ranking is applied and the matching criteria relaxed to further increase the effective precision and to increase the number of correct diagnoses. In addition, the method reduces the number of bridging fault candidates by constructing a dictionary of composite signatures of node pairs based on a ranking threshold.

15 Claims, 2 Drawing Sheets

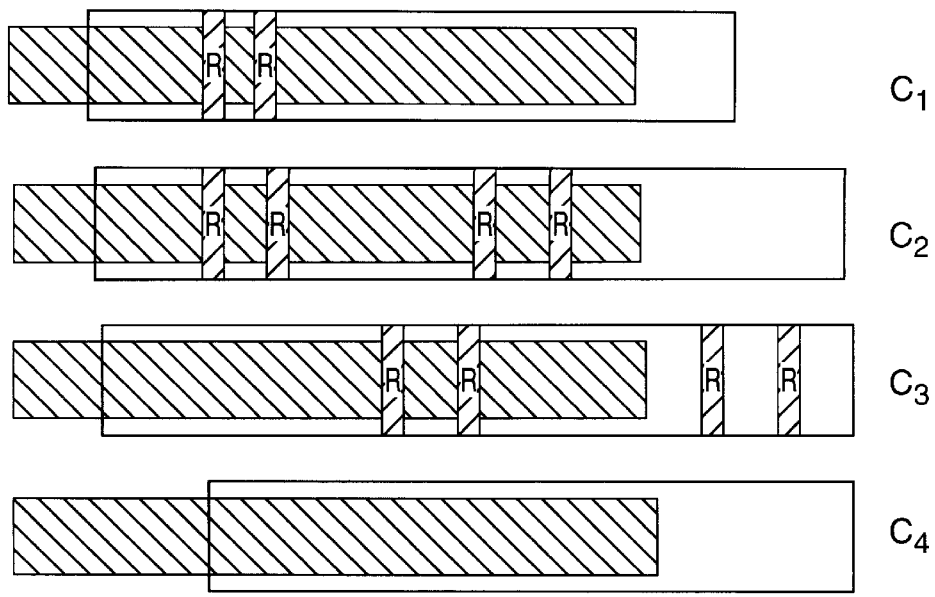
FIG. – 5
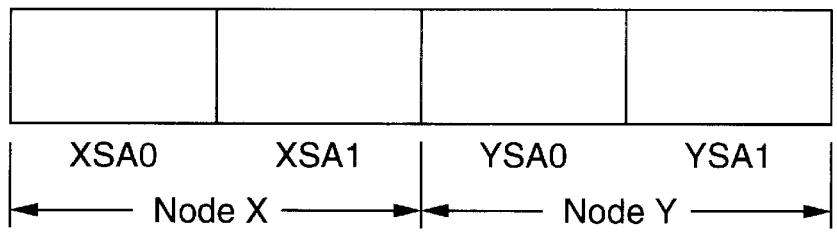
FIG. – 6
| Composite Stuck - At Signatures | | Intersection |
|---|---|---|
| ASA0 | ASA1 | 60 |
| BSA0 | BSA1 | 51 |
| CSA0 | CSA1 | 48 |
| DSA0 | DSA1 | 42 |
| ESA0 | ESA1 | 30 |
| FSA0 | FSA1 | 20 |
FIG. – 7

METHOD FOR DIAGNOSING BRIDGING FAULTS IN INTEGRATED CIRCUITS

CROSS-REFERENCE TO RELATED APPLICATIONS

Not Applicable
or
This application claims priority from U.S. provisional application Ser. No. 60/030,280 filed on Nov. 4, 1996, which is incorporated herein by reference.

STATEMENT REGARDING FEDERALLY SPONSORED RESEARCH OR DEVELOPMENT

This invention was made with Government support under Grant Nos. MIP 9158490 and MIP 915849, awarded by the National Science Foundation. The Government has certain rights in this invention.

REFERENCE TO A MICROFICHE APPENDIX

Not Applicable

NOTICE OF MATERIAL SUBJECT TO COPYRIGHT PROTECTION

All of the material in this patent document is subject to copyright protection under the copyright laws of the United States and of other countries. The owner of the copyright has no objection to the facsimile reproduction by anyone of the patent document or the patent disclosure, as it appears in the United States Patent and Trademark Office file or records, but otherwise reserves all copyright rights whatsoever.

BACKGROUND OF THE INVENTION

1. Field of the Invention

This invention pertains generally to failure analysis methods applied to electronic circuitry, and more particularly to a method for diagnosing bridging faults in integrated circuits.

2. Description of the Background Art

Ensuring the high quality of integrated circuits (IC) is important for many reasons, including high production yield, confidence in fault-free circuit operation, and the reliability of delivered parts. Rigorous testing of circuits can prevent the shipment of defective parts, but improving the production quality of a circuit depends upon effective failure analysis; that is, the process of determining the cause of detected failures. Discovering the cause of failures in a circuit can often lead to improvements in circuit design or manufacturing processes, with the subsequent production of higher-quality integrated circuits.

Failure analysis usually comprises two tasks: fault diagnosis, which is a logical search to determine the likely sources of error, using circuit information and details about how the circuit failed; and fault location or defect identification, which is a physical search to discover the mechanism of failure in the actual defective part. Given the enormous number of circuit elements in modern ICs, and the number of layers in most complex circuits, physical searches cannot succeed without considerable guidance from fault diagnosis. If the diagnosis is either inaccurate or imprecise (identifying either incorrect or excessively many fault candidates, respectively), the process of fault location will consume, and possibly waste, considerable amounts of time and effort.

Bridging faults, which are defined as the unintentional electrical shorting of two gate outputs, are believed to be a common defect type in integrated circuits and their diagnosis is considered to be crucial in IC manufacturing. A circuit with n nodes has $$\binom{n}{2}$$

possible bridging faults; explicit consideration of all such faults in infeasible. Therefore, a need exists for a fast, accurate and computationally non-complex method for precise diagnosis of bridging faults, particularly with respect to combinational CMOS circuits and full-scan sequential circuits, in which all state elements are controllable and observable. Prior to the present invention, that need has not been met by the conventional diagnostics discussed below.

Fault diagnosis is the logical component of failure analysis; appropriately, its domain is that of the logical fault, or simply fault, which is an abstract representation of how an element in a defective circuit misbehaves. A description of the behavior and assumptions about the nature of a logical fault is referred to as a fault model.

As with testing, diagnosis traditionally involves the choice of a fault model; the most popular fault model for both testing and diagnosis is the single stuck-at fault model, in which a node in the circuit is assumed to be unable to change its logic value. The stuck-at model is popular due to its simplicity, and because it has proven to be effective both in providing test coverage and diagnosing a limited range of faulty behaviors. However, other fault models can be used in diagnosis, and will as be discussed.

The concepts of fault and fault model are separate from that of a defect, which usually refers to the physical mechanism, such as an electrical short or open, that produces the incorrect behavior of the circuit. A logical fault description is an abstract means of representing a defect, an aspect of defect behavior, a class of defects, or several classes of defects. For example, a stuck-at fault is commonly thought to represent the defect of a circuit node being shorted to either power or ground.

While it is common (and convenient) to speak of diagnosis as identifying or locating faults in a circuit, the underlying target of diagnosis is ultimately a physical defect; the fault models used are simply useful abstractions in the eventual identification of a defect or defect location. As will be discussed in the following sections, the association of diagnostic fault model to targeted defect is not inviolable: a diagnosis may be performed using one fault model while e targeting a defect more accurately represented by another fault model.

The traditional method of fault diagnosis, referred to as cause-effect analysis, has been described as test-based fault localization; that is, identification of a defect location by comparing A failures observed on a tester with those predicted in fault simulation. A fault simulator will describe the behavior of a circuit in the presence of a particular instance of a modeled fault, usually in the form of a fault signature. A fault signature is the complete list of all input patterns (or test vectors) and circuit outputs by which a fault is detected. Note, however, that term fault signature is often reserved for only the response of faulty circuits under test. For example, the term fault signature has been defined in the art as the characteristic function of the erroneous response produced by a fault without regard to fault type. In the description herein, however, as in much of common usage, the term signature is applied to actual behaviors, as well as simulated and abstract faults, such as in stuck-at signature and composite signature, which will be introduced later.

The process of test-based fault localization, then, is one of comparing the observed faulty behavior of the circuit with a set of fault signatures, each representing a fault candidate. The resulting set of matches, if any, constitutes a diagnosis.

Many early diagnostic systems used a simple matching process, in which the signature of a fault candidate would either have to match exactly the circuit's fault signature, containing every error-carrying vector and output, or would have to be a subset thereof. As diagnostic techniques matured, the matching process became more flexible; a good example of a simple generalization is known as the partial-intersection operation that ranks matches by the size of intersection. Matching algorithms employed by diagnostic techniques are often essential in translating from abstract fault models to defects, or from targeted fault models to untargeted faults, or to handle the vagaries of faulty circuit behavior.

The following sections describe previous approaches taken to the problem of fault diagnosis. As indicated above, most traditional (cause-effect) techniques involve two primary elements: a fault model, and a comparison or matching algorithm. The approaches described are primarily organized by the fault model used: stuck-at, bridging, or another model. Each technique is presented with a description of the matching algorithm used for diagnosis construction. Subsequent sections discuss other techniques that are not as easily categorized by fault model and matching algorithm.

2.1 Stuck-at fault diagnosis.

Early fault diagnosis systems targeted only stuck-at faults; the fault candidates were stuck-at nodes, and the candidates were described by stuck-at fault signatures. In addition, the actual defect mechanism was interpreted strictly as a single stuck-at circuit node; other defect types could not necessarily be precisely diagnosed.

Many early systems of VLSI diagnosis, such as Western Electric Company's DORA and an early approach of Teradyne, Inc., attempted to incorporate the concept of test-based fault localization with the previous-generation method of diagnosis, called guided-probe analysis. Guided-probe analysis employed a physical voltage probe and feedback from an analysis algorithm to intelligently select accessible circuit nodes for evaluation. The Teradyne and DORA techniques attempted to supplement the guided-probe analysis algorithm with information from stuck-at signatures.

Both systems used relatively advanced (for their time) matching algorithms. The DORA system used a nearness calculation referred to as fuzzy match. The Teradyne system employed juts the concept of prediction penalties where the signature of a candidate fault is considered a prediction of some faulty behavior, made up of (output:vector) pairs. When matching with the actual observed behavior, the Teradyne algorithm scored a candidate fault by penalizing for each (output : vector) pair found in the stuck-at signature but not found in the observed behavior, and penalizing for each <output:vector> pair found in the observed behavior but not the stuck-at signature. These have commonly become known as misprediction and non-prediction penalties, respectively. A related Teradyne system introduced the processing of possible-detects, or outputs in stuck-at signatures that have unknown logic values, into the matching process.

A system that uses a more sophisticated algorithm of parameterized matching has recently been presented by De and Gunda; in this system, the user can specify the relative importance of misprediction and non-prediction. A quantitative ranking is assigned to each stuck-at fault, from which some indication can be made about the existence of multiple stuck-at faults. In this way, the system can explicitly target defects that behave similar to the stuck-at model, including some opens, and multiple distinguishable stuck-at defects; it can also implicitly diagnose less-distinguishable multi-node defects, such as bridging faults, but with less expected success.

The example systems described above characterize the general trend of stuck-at model into diagnosis, from simple to complex matching algorithms. It has become evident that most failures in CMOS circuits do not behave exactly like single stuck-at faults. The inclusion of increasingly more-complicated algorithms is the necessary result of the reliance of these systems on the overly-simple single stuck-at fault model.

2.2 Bridging fault diagnosis.

Much of the attention in diagnosing modem circuits has turned from the stuck-at model to the bridging fault model, motivated by the common occurrence of shorted nodes. The majority of spot defects in modem CMOS technologies cause changes in the circuit description that result in electrical shorts, which implies that many failures can be modeled by bridging faults. To address this, several approaches have been taken towards incorporating the bridging fault model into traditional test-based fault localization.

The first steps towards bridging fault diagnosis retained the legacy of stuck-at signatures, using these readily-available fault descriptions to approximate or identify bridging fault behavior. Many simple approaches merely compared stuck-at signatures to the observed behavior, and implicated the (single) nodes which most closely matched. One approach, however, proved to be fairly interesting. That approach, referred to as MMA, was developed by Millman, McCluskey, and Acken. In MMA, pseudo-signatures for bridging faults are constructed from stuck-at signatures for the bridged nodes and a simple subset matching algorithm is employed. A more conventional application of stuck-at signatures, paired with a sophisticated matching algorithm, was developed by Chakravarty and Gong. However, both of those methods suffer from imprecision; the average diagnoses for both are very large, consisting of hundreds or thousands of candidates.

Diagnosing bridging faults with available single stuck-at fault information is an appealing idea, but such an approach can lead to unusably large diagnoses or an unacceptable percentage of misleading diagnoses, in which neither node involved in the actual short is identified by the fault candidates. To address those deficiencies, Aitken and Maxwell built dictionaries comprised of realistic faults. That approach is truly cause-effect analysis using the bridging fault-model; that is, the fault candidates are the same faults targeted for diagnosis. The method provides both excellent accuracy and precision; there are very few misleading diagnoses, and the resulting diagnoses are very small (less than 10 candidates).

While there are obvious advantages to diagnosing bridging faults with available single stuck-at faulting information, there are significant costs. The number of realistic faults in a circuit is significantly larger than the number of single stuck-at faults for a circuit; also, the cost of simulating each individual realistic fault is frequently much greater, requiring much more detailed knowledge of the circuit for model construction. In addition, actual bridging fault behavior often diverges from simulated behavior, requiring validation and refinement of the models. The continued search for a method of diagnosing bridging faults using inexpensive stuck-at signatures is driven by the cost and complexity of realistic fault models; the present invention presents such an approach, yielding similar results to the realistic fault model approach, but at a much lower cost.

A completely different approach is taken by methods referred to as $I_{DDQ}$ diagnosis. In $I_{DDQ}$ diagnosis, an otherwise static circuit is monitored for excessive current flow, which would indicate a fault-induced path from power to ground. Fault signatures can be constructed for $I_{DDQ}$ measurement; errors are detected at a single output, the point of current measurement. Normal test-based fault localization can then proceed, matching expected failures to observed failures. In addition, voltage (logical) measurements can be taken at the outputs, and conventional fault signatures used to refine the diagnosis. The advantages of $I_{DDQ}$ diagnosis are that the $I_{DDQ}$ signatures are easy to construct, and the resulting diagnoses are usually both precise and accurate. The disadvantages are that not all circuits are $I_{DDQ}$ testable; in addition, a large number of chips fail all $I_{DDQ}$ patterns applied.

2.3 Other approaches.

Several approaches to fault diagnosis are not neatly categorized by the combination of fault model and algorithm specification used above. Some have attempted to eliminate or minimize fault simulation, instead relying on such information as the propagation and sensitization cones of individual faults or fault-free circuit nodes. The approaches suggested by Abramovici and Breuer and Rajski and Cox are examples, and are referred to as effect-cause analysis. Both attempt to identify all fault-free lines, and so can implicitly diagnose multiple faults and various fault types, although the resulting diagnoses are often pessimistic and imprecise.

A technique that incorporates elements of both test-based fault localization and effect-cause analysis has been presented by Waicukauski and Lindbloom. The technique relies on a great deal of information: in addition to propagation and sensitization path information, it requires knowledge of internal-node logic values to eliminate candidate nodes. Stuck-at fault simulation is performed, but only for a reduced set of fault candidates. While the presented theory assumes stuck-at behavior for individual faulty nodes on a per-vector basis, it also allows for complex fault behaviors: specifically multiple-site faults. While this technique offers a great deal of flexibility in targeting faults, its computational cost and diagnostic precision are matters of concern.

2.4 Inductive fault analysis.

The techniques described above do not use physical layout information to diagnose faults. Intuitively, however, identifying a fault as the cause of a defect has much to do with the relative likelihood of certain defects occurring in the actual circuit. Inductive Fault Analysis (IFA) uses the circuit layout to determine the relative probabilities of individual physical faults in the fabricated circuit.

Inductive fault analysis uses the concept of a spot defect (or point defect), which is an area of extra or missing conducting material that creates an unintentional electrical short or break in a circuit. As these spot defects often result in bridge or open behaviors, inductive fault analysis can provide a fault diagnosis of sorts: an ordered list of physical faults (bridges or opens) that are likely to occur, in which the order is defined by the relative probability of each associated fault. The relative probability of a fault is expressed as its weighted critical area (WCA), defined as the physical area of the layout that is sensitive to the introduction of a spot defect, multiplied by the defect density for that defect type. For example, two circuit nodes that run close to one another for a relatively long distance provide a large area for the introduction of a shorting point defect; the resulting large WCA value indicates that a bridging fault between these nodes is considered relatively likely.

Inductive fault analysis can alternatively be applied to diagnosis for the creation of fault lists. Inductive fault analysis tools such as Carafe can provide a realistic fault list, important for fault models such as the bridging fault model, in which the number of possible faults is intractable for most circuits. By limiting the candidates to only faults that can realistically occur in the fabricated circuit, a diagnosis can be obtained that is much more precise than one that results from consideration of all theoretical faults.

2.5 The MMA algorithm.

As indicated above, MMA suffers from computational complexity and imprecision. Like many other stuck-at based techniques, MMA has the disadvantage of intractable diagnosis size.

In addition, the MMA technique was originally demonstrated only on circuits smaller than nearly every circuit in the ISCAS-85 benchmark suite. The MMA technique also disregards bridge resistance, variable downstream logic thresholds, and the possibility of state-holding bridging fault behavior. These simplifying assumptions, however, enabled an approach to diagnosing bridging faults using relatively simple stuck-at information, a desirable feature considering the expense of realistic fault models.

Despite its shortcomings, however, the MMA technique has many advantages, the most notable of which are the use of the ubiquitous single stuck-at fault model, obviation of the need for additional circuit information for bridging fault diagnosis, and a small likelihood of misleading diagnoses under modeled conditions.

2.5.1 MMA theory.

When MMA was first introduced, it used what is referred to as the voting model to describe bridging fault behavior. The MMA diagnostic theory, described below, followed from some relatively simple observations about bridging fault behavior under the voting model.

Assume that a test vector v detects a bridging fault in a CMOS circuit. A detected trio error necessarily indicates that the two bridged nodes have opposite fault-free logic values for this vector. The driving transistor networks of these two nodes will each attempt to assert competing logic values on the bridge; the resulting bridge voltage is determined by the drive strengths, or conductances, of the competing networks. In the voting model, the stronger network wins this competition, or vote, and asserts its logic value on the bridged nodes.

The application of v causes one node to outvote the other, driving the outvoted node to a faulty logic value. The key observation of the MMA technique is that since v is able to sensitize the outvoted node and propagate the faulty value to a circuit output, it must also detect the stuck-at fault for the outvoted node stuck at the faulty value. Therefore, v must appear in a complete list of detecting vectors for this stuck-at fault on the outvoted node.

This complete list of the detecting vectors for a particular fault is contained in its fault signature. The basis of the MMA technique is the construction and use of composite signatures for each potential bridging fault. The composite signature of a bridging fault is the union of the four associated single stuck-at signatures. As shown in FIG. 1, the MMA composite signature for node X bridged to node Y is the union of the four stuck-at signatures for the two bridged nodes, where each stuck-at signature is a set of output:vector pairs. By the reasoning given above, MMA concludes that the fault signature of a bridging fault will be contained in, or will be a subset of, the bridging fault's composite signature.

The process of diagnosis can be outlined with the use of a few definitions. First, let v and o represent vector and output (single output pin) variables, respectively. Then, let v represent a logical value: v(o, v) is the logical value at output o upon application of vector v in the fault-free circuit; and $v_f$ (o, v) is logical value at output o upon application of vector v in the presence of fault f.

The observed faulty behavior is represented by $B_f$, the set of error-carrying (output: vector) pairs:

$$B_f = \{\forall (o:v) | v(o,v) \neq v_f(o,v)\}. \quad (1)$$

In the rest of this description, the subscript f will be dropped from B, since it is understood that B will refer to a single faulty behavior.

The MMA technique builds a composite signature, denoted here by $C_f$, for every possible node pair in the circuit, from four stuck-at signatures, denoted by $S_f$. In this notation, $S_{X0}$ refers to the stuck-at signature for node X stuck-at 0, and $C_{X@Y}$ refers to the composite signature for node X bridged to node Y. Duplicates entries in $C_f$ are dropped after concatenation.

$$S_{X0} = \{\forall (o:v) | v(o,v) \neq v_{X0}(o,v)\} \quad (2)$$

$$C_{X@Y} = S_{X0} \cup S_{X1} \cup S_{Y0} \cup S_{Y1} \quad (3)$$

The MMA diagnostic algorithm compares each composite signature with the observed behavior; a composite signature containing entries that are a superset of the entries contained in the observed faulty behavior is said to be a match. Note that since o represents a single output pin, there is an entry representing every error-carrying output pin for every vector in $S_f$, $C_f$, and $B_f$. Therefore, the subset matching criteria applies to outputs as well as vectors.

The MMA diagnosis of a bridging fault is a list of candidate bridging faults having composite signatures that match the observed faulty behavior. A diagnosis can be formalized as $$D = \{\forall C_i | B \subseteq C_i\}, \quad (4)$$

where the subscript i indicates an index through all (composite signature) candidates. Note that this technique does not require explicit simulation of bridging faults, only stuck-at fault simulation to create stuck-at signatures.

All of the previously-described operations, including composite signature construction and candidate matching, are demonstrated in Table 1 and Table 2. Table 1 gives a stuck-at fault dictionary, or list of all stuck-at faults and their signatures, for a trivial circuit of only three nodes and a single output. The nodes are labeled A, B, and C; the output is unnamed and for simplicity is omitted from the signatures. Table 2 shows the resulting MMA composite bridging fault dictionary, with composite signatures constructed as described previously.

The two diagnosis examples of Table 1 and Table 2, while trivial, demonstrate both the relative simplicity and the imprecision characteristic of the MMA technique. The first observed behavior, {1, 2, 4}, is a subset of all three composite signature candidates; that, it matches all bridging faults and, therefore, the diagnosis therefore implicates every node pair in the circuit. The second observed behavior {2, 3} is also poorly distinguished, as it matches with two of the three candidates; faults (B@C) and (C@A). Note that while the bridging fault diagnoses are imprecise, all six stuck-at faults are uniquely identified by their stuck-at signatures; this resolution is lost, however, in the construction of the composite signatures.

2.5.2 Evaluating diagnoses.

As defined above, a match is a subset relation between the observed faulty behavior and a composite signature. If the identity of the actual fault is known, an individual match can be evaluated for correctness: does a matching composite signature identify, completely or partially, Go the nodes involved in the actual bridging fault? Extending from this, the quality of a diagnosis can be evaluated as the quality of its component composite signature, or fault candidate, matches.

For this purpose, a bridging fault is assumed to involve exactly two nodes; all matching composite signatures similarly correspond to bridging fault candidates made up of two nodes. There are then three types of matches defined in MMA: A correct match correctly identifies both of the nodes involved in the bridge, a partial match correctly identifies only one of the nodes involved in the bridge, and a misleading match identifies neither of the nodes involved in the bridge. An example bridging fault and examples of each type of corresponding match are given in Table 3.

Having defined the types of matches, in MMA terminology the quality of a diagnosis is indicated in one of three ways, based on the matches used to construct it. An exact diagnosis contains only the correct match, a partial diagnosis contains the correct match in addition to other matches, and an incorrect diagnosis does not contain the correct match. Incorrect diagnoses can be further divided into three categories as shown in Table 4. An incomplete diagnosis contains partial matches but not the correct match, a misleading diagnosis contains only misleading matches, and a failed diagnosis is empty. (All diagnosis types except incomplete, introduced for purposes of the present invention, are defined in MMA). Incomplete, misleading, and failed diagnoses are all considered incorrect diagnoses, as they do not contain the correct match. Although all types of incorrect diagnoses are undesirable, it is much better to have a failed diagnosis than a misleading diagnosis; a failed diagnosis is clearly incorrect and cannot mislead the search for a defect.

If a bridging fault can create a feedback loop in the circuit, some test vectors may cause circuit outputs to oscillate. Such a vector is said to only possibly detect (or potentially detect) the bridging fault. Under the assumptions made in the definition of MMA, namely, for two bridged nodes, with one node outvoted and error-carrying for any detecting vector, zero-resistance bridges, and the bridge voltage being a definite logic value with regard to downstream gates, the inclusion of possibly detecting test vectors can lead to misleading and failed diagnoses; but if the possibly detecting vectors are ignored, misleading and failed diagnoses will not occur, and the correct fault will always be part of the diagnosis. This is stated as a theorem in MMA:

When possibly detecting patterns are ignored, the fault signature of a bridging fault must be contained in its composite signature.

The MMA theorem guarantees that incorrect diagnoses will not occur, but it places no bound on the size of the diagnosis. A diagnosis with many misleading or partial matches is undesirable; it can result in the investigation of portions of the chip not involved in the fault. This is potentially frustrating, because physical investigation of the failed part sometimes requires destruction of the layers above the site of the suspected defect. Once these layers are gone, nearby suspected sites cannot be investigated. The size of the average diagnosis using the MMA technique on the ISCAS- 85 benchmark circuits is at least 33 matches (for the C880) and can reach over 200 matches (for the C7552).

The MMA theorem guarantees that the correct match will appear in the diagnosis—as long as the observed behavior of the fault is not affected by variable logic thresholds, which commonly affect the behavior of faulty CMOS circuits.

2.5.3 Byzantine Generals Problem.

In order to be detected with a logic test, a bridging fault must create an error that is propagated to one or more circuit outputs. At the fault site, this error is a voltage that is subject to interpretation as different logic values by downstream logic gates. Because gate input logic thresholds are not identical, different downstream gates can interpret the voltage as different logic values: this phenomenon is known as the Byzantine Generals Problem for bridging faults. FIG. 2 shows a simple example of voltage interpretation in the presence of variable logic thresholds. Node B has an intermediate (faulty) voltage value due to the presence of a bridge. Each gate interprets the voltage as a different logic value.

This behavior has important implications for diagnosis: the propagation conditions for the error induced by a bridging fault are not necessarily the same as those caused by a stuck-at fault. Therefore, a detecting test vector may or may not display the same behavior at the circuit outputs for a bridging fault as for a stuck-at fault on one of the bridged nodes. Note that the faulty voltage on node B in FIG. 2 will not cause the circuit to appear, for the node values shown, as if B were stuck-at 1 or stuck-at 0; each circuit output reports evidence that there is a different value on node B.

The Byzantine Generals Problem can affect diagnosis in several ways. It might cause the error introduced by the bridging fault to be propagated to more or fewer circuit outputs than would be affected by a single stuck-at fault. Alternatively, the error introduced by the bridging fault may be detected by a vector, or propagated to an output, that would never evince an error for any one of the four single stuck-at faults. The Byzantine Generals Problem may also cause errors to occur downstream from both of the bridged nodes at the same time. Each of these is an example of how variable logic thresholds nullify the previously-stated MMA theorem and cause incorrect diagnoses to result for real circuits.

2.6 Candidate space problems.

The purpose of fault diagnosis in electronic circuits, and particularly in integrated circuits, is to identify the location of a fault so that the cause of the fault can be categorized. This is is necessary for several steps in the manufacturing process: the initial system debug, the ramp to volume production, the yield improvement phase, and volume manufacturing testing. As IC manufacturing technology becomes more complex and feature sizes continue to shrink, the manual search and categorization of defects is becoming exceedingly expensive and time-consuming. The expense of a manual search makes it crucial for automated diagnosis tools to pinpoint the location of a defect to only a few locations.

As a result, two general approaches to this candidate-space problem have been previously developed.

The first conventional approach assumes that all $$\binom{n}{2}$$

possible bridging faults for a circuit need to be considered. However, building an $$\binom{n}{2}\text{-sized}$$

fault dictionary is prohibitively expensive, so this line of research has focused on algorithms that continuously eliminate large portions of the candidate space based on the observed fault signature (without building a dictionary). Once a bridging fault is removed from the candidate space it is no longer considered. A major weakness of this approach is that if the bridging fault's behavior is not well-characterized, it is likely to be removed from the diagnosis. A major strength is that the physical design of the circuit is not necessary for diagnosing potential bridging faults.

The second conventional approach uses the physical design of the circuit to eliminate bridging faults between lines that are extremely unlikely to be shorted together due to the physical location of the nodes comprising the bridging fault. If the two nodes are never closer than some minimum distance, or if there is another node separating them that would also be involved in the bridge, then that bridging fault is not considered. Errors in understanding and predicting the bridging fault behavior are tolerated by finding the best match to the observed signature. However, at times information about the physical design of the circuit is proprietary, the degree of information stored about a circuit changes over its lifecycle, or the number of nodes is simply too large to explicitly consider all pairs.

Most commercial automated diagnosis tools rely on the "stuck-at" fault model as a basis for fault diagnosis. However, it has been shown repeatedly that the stuck-at fault model does not accurately reflect the behavior of current-generation silicon defects. While a more realistic fault model provides better diagnoses, a bridging fault diagnosis algorithm that uses the stuck-at fault model as a foundation would not require a sacrifice of performance or a change in existing design flows. Therefore, there is a also a need for a method of diagnosing bridging faults that uses the stuck-at model and which, if necessary, can be utilized without having specific physical information about the circuit.

BRIEF SUMMARY OF THE INVENTION

The present invention comprises a method for fault diagnosis of electronic circuits and, in particular, a method for diagnosing bridging faults with stuck-at signatures, with several important changes to the conventional MMA technique. By way of example, and not of limitation, only those faults determined to be realistic through inductive fault analysis are considered as candidates. The number of realistic faults is much smaller than the number of all theoretically possible bridges, not only improving the precision of the diagnoses, but making the technique feasible for much larger circuits. Second, match restrictions and match requirements are imposed during matching in order to minimize diagnosis size. Finally, match ranking is applied and the matching criteria relaxed to further increase the effective precision and to increase the number of correct diagnoses. Using all described improvements, the reported experiments show that at least 90% of the time the correct match is found in a diagnosis of size ten or less, a significant indication of diagnostic effectiveness.

Furthermore, it will be appreciated that the use of stuck-at fault information to perform bridging fault diagnosis is based on a somewhat simplified view of bridging fault behavior: in order for a bridging fault to be detected, the two bridged nodes must have opposite values in the fault-free circuit but, in the presence of the fault, both bridged nodes will have the same value one of the two nodes will dominate). This means that any vector that detects a bridging fault will detect one of the four stuck-at faults associated with the two nodes. To avoid having to build a prohibitively expensive $$\binom{n}{2}\text{-sized}$$

fault dictionary, the present invention further comprises two alternative embodiments of a method to reduce the candidate space involved in bridging fault diagnosis without the aid of physical design information. The first embodiment uses the intuitive idea of an initial stuck-at fault diagnosis to attempt to identify one of the bridged nodes. The second embodiment technique identifies all candidates that can have an arbitrary intersection threshold with the behavior, providing an optimal diagnosis under our scoring criteria. Both embodiments only consider and construct O(n) candidates, about as many as previously reported when using realistic fault lists. Either embodiment can be used to minimize the construction of composite signatures even when beginning with a realistic fault list.

An object of the invention is to provide a fast, accurate and computationally non-complex method for precise diagnosis of bridging faults.

Another object of the invention is to reduce the size of the fault dictionary required for bridging fault diagnosis.

Another object of the invention is to improve the conventional MMA technique for bridging fault diagnosis.

Another object of the invention is to diagnose bridging faults in absence of physical information regarding a circuit.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only:

FIG. 5 is a diagram showing four candidate faults compared with the same observed behavior, and their corresponding rankings.

FIG. 6 is a diagram showing a composite signature constructed from four stuck-at signatures or two node signatures.

FIG. 7 is a diagram showing several node (or composite stuck-at) signatures ranked by their comparison to observed behavior.

DETAILED DESCRIPTION OF THE INVENTION

Figure 1:
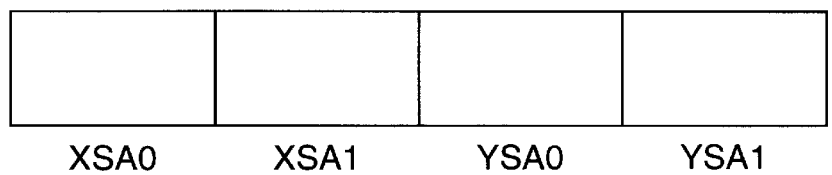
FIG. 1 is diagram showing that an MMA composite signature for a node X bridged to a node Y is the union of four stuck-at signatures.
Figure 2:
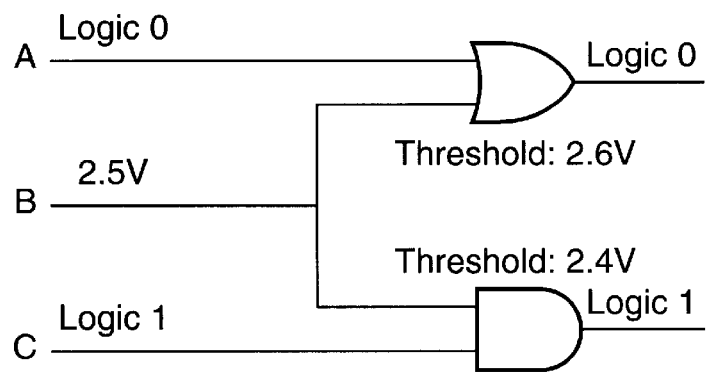
FIG. 2 is a logic diagram illustrating the Byzantine Generals Problem for bridging faults, were node B is shown as having an intermediate (faulty) voltage value due to the presence of a bridge and each gate shown interprets the intermediate voltage as a different logic value.

While the original MMA technique is attractive because of its use of simple stuck-at signatures for diagnosing bridging faults, the technique exhibits a number of inadequacies; namely, large average diagnoses, unordered fault candidates, and a significant percentage of failed diagnoses. The present invention improves the MMA technique by addressing each of these inadequacies and thereby providing a method that is not only relatively inexpensive to implement, but also a method that is precise, accurate, and able to compensate for failures resulting from the effects of the Byzantine Generals Problem.

1. Match restriction.

A weakness of the MMA technique is that a faulty signature is likely to be contained in a large number of composite signatures. The larger a composite signature, the broader the range of potential matches, and the less likely it is to match only the faulty signature representing a bridge between the two candidate nodes. If unreasonable portions of the composite signature could be identified and removed, the result would be fewer matches per diagnosis and a commensurate increase in diagnostic precision.

The first improvement to MMA afforded by the present invention is to eliminate from a composite signature any entries that cannot be used to detect the described bridging fault. In order for a bridging fault to be detected, a test vector must stimulate opposite logic values on the two bridged nodes. Removing vectors that place identical values on the bridged nodes results in a composite signature that more precisely contains the possible behavior of the bridging fault.

Any vector in a composite signature that detects the same-valued stuck-at fault on both bridged nodes must stimulate the same value on both nodes; such a vector cannot detect the bridging fault and can be dropped from the composite signature. For example, a vector that detects both X stuck-at 0 and Y stuck-at 0 cannot detect X bridged to Y, and this vector can be removed from the composite signature for X bridged to Y. In terms of the notation introduced previously, match restriction can be expressed as $$U_{X@Y}=\{\forall(o\!:\!v)|(v\!\in\!S_{X0}\wedge v\!\in\!S_{Y0})\vee(v\!\in\!S_{X1}\wedge v\!\in\!S_{Y1})\}, \quad (5)$$

where $U_{X@Y}$ represents the set of restricted (unallowed) vectors for the bridging fault X bridged to Y. The composite signature under the improved technique is therefore $$C_{X@Y}=S_{X0}\cup S_{X1}\cup S_{Y0}\cup S_{Y1}-U_{X@Y}. \quad (6)$$

Note that this method is not exhaustive, as there are probably other vectors that place identical values on the bridged nodes; however, this improvement requires no more information that that contained in the stuck-at signatures.

Exhaustive information, however, may be available, usually from a logic simulator or from the fault simulator used to generate the test set; a subsequent section presents the improvement in diagnostic precision that can be achieved using such information. The exhaustive form of match restriction can be represented as $$U_{X@Y}=\{\forall(o\!:\!v)|v(X,v)=v(Y,v)\}. \quad (7)$$

A strength of match restriction, regardless of the source of node logic value information, is that it is not affected by the Byzantine Generals Problem; it can never increase the number of incorrect diagnoses.

2. Match requirement.

While the match restriction of the previous section relied on identifying test vectors that cannot detect a particular bridging fault, the improvement presented in this section is based on vectors that should detect a bridging fault; namely, those vectors that place opposite logical values on the bridged nodes and detect single stuck-at faults on both of the bridged nodes. The second improvement to MMA afforded by the present invention is based on identifying such vectors in the composite signatures, and then enforcing a match requirement on those vectors.

If during the construction of a composite signature a single vector is recognized as detecting both X stuck-at 0 and Y stuck-at 1 (or X stuck-at 1 and Y stuck-at 0), it is marked as a required vector. The set of required vectors, $R_{X@Y}$, can be defined as $$R_{X@Y} = \{\forall (o:v) | (v \in S_{X0} \wedge v \in S_{Y1}) \vee (v \in S_{X1} \wedge v \in S_{Y0})\}. \tag{8}$$

In order for the composite signature to match with an observed fault signature, the observed behavior must contain errors for all required vectors.

Figure 3:
FIG. 3 is a diagram showing the composite signature of node X bridged to node Y with match restrictions shown in black and match requirements labeled R.

FIG. 3 illustrates the composite signature of a fault candidate for node X bridged with node Y; it shows how the candidate is composed of the four single stuck-at behaviors for X and Y. Match restrictions are shown in black while match requirements are hatched and labeled R. When X stuck-at 0 and Y stuck-at 0 are both detected (or both stuck-at 1s are detected), the bridging fault cannot be stimulated, and those restricted vectors are removed from the fault candidate. When a particular vector detects both X stuck-at 0 and Y stuck-at 1 (or vice-versa), that vector should detect the bridging fault, and it is flagged as a required vector.

Unlike match restriction described in the previous section, requiring matches can eliminate the correct match from a diagnosis. A vector may detect opposite stuck-at values and still fail to detect the bridging fault because the Byzantine Generals Problem could prevent fault propagation. In addition, if the bridge has a comparatively large resistance, certain vectors may not cause a propagatable error, which may also result in the elimination of the correct match from the diagnosis.

The example diagnoses from Table 1 and Table 2 are revisited in Table 5 and Table 6. These examples demonstrate the application of match restrictions and match requirements, and the more precise diagnoses that result. The dictionary in Table 5 is the same MMA composite bridging fault dictionary shown in the example of Table 1. The dictionary in Table 6 results from the application of match restrictions and match requirements. For example, in the composite signature for fault candidate A@B, vector 2 has been eliminated by match restriction, since it is found in the stuck-at signatures for both Asa0 and Bsa0.

As can be seen, observed behavior {1,2,4} now matches only (B@C), and observed behavior {2,3} now matches only (C@A)—vector 4 is required for (B @ C). Also, vector 4 has been marked as a required vector, indicated by the number in bold italics, since it appears in the stuck-at signatures for both Asa0 and Bsa1. The result is that each of the observed behaviors now match only one candidate. The imposition of match requirements and match restrictions reduces the size of the diagnoses.

3. Match ranking.

In its unmodified form, the MMA technique did not order the elements of a diagnosis; a diagnosis simply consisted of a unranked list of matching candidate faults, with no expression of preference or likelihood assigned to the candidates. An overall ordering and expression of confidence for each candidate would be useful for fault location, both to guide the physical search for defects and to give some indication of the quality of the diagnosis.

The third improvement to MMA afforded by the present invention comprises ranking matches during diagnosis. The complications of bridging fault behavior can cause an MMA diagnosis to fail (not provide any matching candidate faults). By ranking all composite signatures, however, a failed diagnosis can be recovered by constructing a diagnosis out of the best, or highest-ranked, non-matching candidates.

The original MMA technique had a strict matching criterion: either a candidate contained the observed behavior, or it was eliminated from consideration. The present invention, however, by assigning a measure of goodness to every candidate, can instead order the candidates and provide a diagnosis where the original technique would simply fail.

3.1 Matching details and strict matching.

The sole expression of match goodness in the original MMA technique was that the observed faulty behavior be contained in a candidate composite signature. In accordance with the present invention, a more refined set of ordering criteria can be obtained by examining the elements of a typical match in greater detail.

Figure 4:
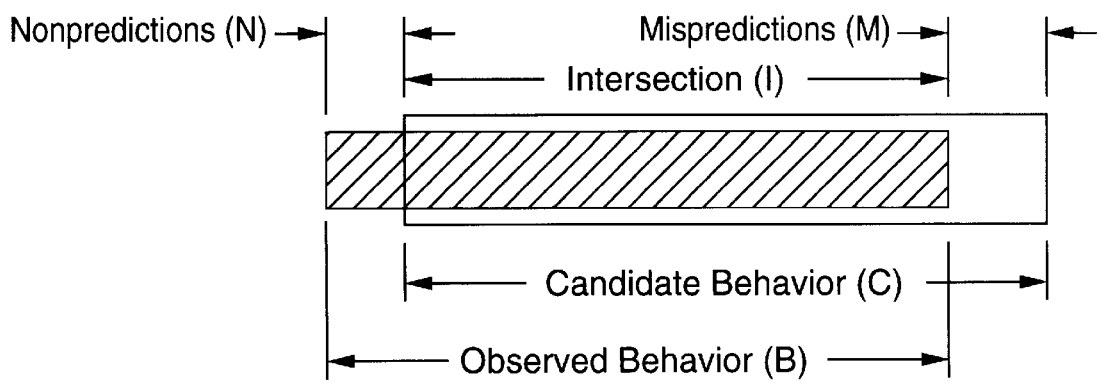
FIG. 4 is a diagram showing the overlapping of candidate behavior and observed behavior.

FIG. 4 shows the comparison between the observed behavior B (hatched) and a candidate fault C (unhatched). The observed output errors that are correctly predicted by the candidate are represented as set I (the intersection), the output errors that are predicted by the candidate but not observed are set M (the mispredictions;-this is also known as the number of nodetects), and the output errors that are observed but not predicted by the candidate are N (the nonpredictions).

The original MMA technique had a single, simple criterion for inclusion in a diagnosis; this criterion was motivated by the design of the composite signatures. Composite signatures are deliberately inclusive; they predict many behaviors that are not expected to occur due to the presence of a bridging fault. However, the MMA theorem states unequivocally that the observed behavior must be contained in the correct composite signature. The behavior is deliberately over-predicted, so while a large amount of misprediction is anticipated, an unpredicted behavior is completely unexpected and so disqualifies a candidate. This is exactly the criterion used in the original MMA technique for inclusion of candidates in a diagnosis, and restated here:

$$D = \{\forall C_i | B \subseteq C_i\}. \tag{9}$$

Another way to state this is that $|N_i|$ must be 0 in order for candidate $C_i$ to be included in the diagnosis.

Note that the present invention implies additional criteria via set $R_i$, the match requirements for candidate $C_i$: the observed behavior must contain all of the match requirements of the candidate, or the candidate is eliminated. A strict-inclusion diagnosis in accordance with the present invention can then be defined as $$D = \{\forall C_i | (B \subseteq C_i) \wedge (R_i \subseteq B)\}, \tag{10}$$

where $C_i$ is the improved composite signature (restricted vectors removed).

3.2 Ranking candidates.

The strict matching described above expresses the important expectations about candidate faults as absolute criteria:

either certain conditions are met, or the candidate is eliminated. The idea behind ranking candidates is to turn these severe accept-or-exclude criteria into a quantitative measure of relative match goodness.

The priorities for judging matches are the same as expressed in the previous section: the primary assertion is that the best candidates are the ones that contain the largest amount of the faulty behavior. Therefore, a candidate that contains a larger percentage of the observed behavior is considered superior to one that contains a smaller percentage; the primary quantitative measure of match goodness is the size of the intersection of the composite signature and observed behavior, or $|I|$.

If this first criterion does not provide enough information to differentiate candidates, the application of match requirements establishes another expectation: the correct candidate will usually contain the required vectors. In order to formalize this expectation, first define $\Re_i$, the percentage of predicted required vectors that are fulfilled by the candidate; if there are no required vectors, $\Re_i$ is 1.

$$\Re_i = \begin{cases} 1 & \text{if } |R_i| = 0 \\ \dfrac{|B \cap R_i|}{|R_i|} & \text{otherwise} \end{cases}$$

Additionally, there exists a third parameter to judge the quality of an individual match: the amount of misprediction. By removing restricted vectors, the expected size of M has been minimized. Given the simplifying assumption that all such mispredictions are equally likely, if two candidates have the same size intersection with the observed behavior, and contain the same percentage of required vectors, but one candidate has a much larger M than the other, this candidate is considered a less-likely description for the faulty behavior.

The total ranking, then, is a lexicographic ordering in which the nonprediction index has priority, followed by the prediction of the required vectors (used to break nonprediction index ties), and finally the misprediction value (used to break ties of the first two metrics). The ranking is expressed as $$\forall\, C_i(|I_i| \geq |I_{i+1}|), \tag{11}$$

$$\forall\, C_i(|I_i| = |I_{i+1}|) \rightarrow (\Re_i \geq \Re_{i+1}), \tag{12}$$

$$\forall\, C_i(|I_i| = |I_{i+1}|) \wedge (\Re_i = \Re_{i+1}) \rightarrow (|M_i| \leq |M_{i+1}|). \tag{13}$$

FIG. 5 shows four candidates faults (unhatched) compared with the observed behavior (hatched) and their resulting ranking. $C_1$, $C_2$, and $C_3$ are ranked higher than $C_4$ because they contain more of the observed behavior, as specified in Equation (11); $C_1$ and $C_2$ are ranked higher than $C_3$ because they contain a higher percentage of required vectors, as specified in Equation (12); and $C_1$ is ranked higher than $C_2$ because it contains less misprediction, as specified in Equation (13).

3.3 Relaxed matching.

Given that the composite signature candidates are now ranked, it is a simple matter to relax the strict criteria for inclusion in a diagnosis, resulting in a policy that will recover diagnoses that would otherwise fail.

A standard technique used by many diagnostic algorithms is to first select an acceptable diagnosis size, d, and then construct a diagnosis of the d highest-ranked candidates. Combining this simple limit with the rankings previously defined, the final rankings and criteria for inclusion in a diagnosis in the improved technique are therefore $$\forall\, C_i(|I_i| \geq |I_{i+1}|), \tag{14}$$

$$\forall\, C_i(|I_i| = |I_{i+1}|) \rightarrow (\Re_i \geq \Re_{i+1}), \tag{15}$$

$$\forall\, C_i(|I_i| = |I_{i+1}|) \wedge (\Re_i = \Re_{i+1}) \rightarrow (|M_i| \leq |M_{i+1}|). \tag{16}$$

$$D = \bigcup_{i=1}^{d} \{C_i\} \tag{17}$$

EXAMPLES

In Example 1, baseline data is given for conventional MMA. In Example 2, the ranking of the correct match is reported as an evaluation of the match ranking technique. In addition, results are given that show the number of diagnoses that would fail under the strict matching criteria of conventional MMA, and the number that are successfully recovered (the correct match is found in the top d candidates) by the improved technique. The results demonstrate that the to ranking system does indeed reflect the quality of the matches in a diagnosis, since the correct match is almost always ranked among the top three candidates selected.

The improved technique of the present invention uses a different set of criteria to construct a diagnosis (as described in Sections 3.2 and 3.3), making the direct comparison of conventional MMA (baseline) and improved results difficult. To allow this comparison, the experimental results for the present invention presented in Example 2 have been processed and presented in the same form used in Tables 7 and Table 8 in Example 1 for conventional MMA. The results given in Table 9 through Table 12 of Example 2 show what would result if strict matching (Section 3.1) were used in the improved technique of the present invention.

Example 1

Baseline Results for Conventional MMA (a) Realistic bridging faults.

The first issue to be addressed when implementing the conventional MMA technique is the construction of the composite signatures. A single entry is created from stuck-at signatures by concatenating the four fault signatures of two distinct nodes. There are, however, $$\binom{n}{2}$$

possible bridging faults in an n-node circuit, making both the construction and use of all possible composite signatures impractical for most circuits.

One solution is to limit the construction of composite signatures to only realistic bridging faults, as identified by inductive fault analysis. While IFA requires layout information, this additional requirement is usually not unreasonable. Most often, before a defect is diagnosed, the physical design is completed and known, and therefore the realistic faults can be extracted. For this research, realistic bridging fault lists were created for the MCNC layouts of the ISCAS-85 circuits using the well known program Carafe. Restricting the composite signatures to realistic bridging faults cuts the fault lists to a manageable length (for the ISCAS-85 circuits, depending upon the defect sizes assumed, there are three to eight times as many realistic bridging faults as single stuck-at faults).

For the diagnostic trials, faulty output responses were created for the 10% of realistic bridging faults that are most likely to occur based on layout and defect density information. The faults were sampled to reduce the number of trials to a feasible number; the high-probability faults were considered statistically most interesting since, for a sample size of n, they are those n faults expected to occur the most often over a large number of diagnoses. It is important to note that although only a sample of the realistic faults were simulated and diagnosed, the process of diagnosis considers all realistic faults as potential candidates.

(b) Bridging fault simulation.

The well known Nemesis bridging fault simulator was employed to produce the observed faulty behaviors used to evaluate the MMA technique. Note that bridging fault simulation is used only to determine faulty output responses to be diagnosed and not as part of the diagnostic procedure. The behavioral model used by Nemesis for bridging faults is two-component simulation, in which the gates driving the bridged nodes are SPICE-simulated to determine the bridge voltage. The bridge voltage is then compared against the SPICE-computed logic thresholds of downstream gates in order to model the effects of the Byzantine Generals Problem. The simulator also extensively models feedback bridging faults. If a feedback bridging fault evinces the potential to oscillate or hold state, as verified by the Test Guarantee Theorem, the simulator biases the bridge voltage in favor of the fault-free value on the rear bridged node, thereby disallowing oscillation and state-holding behavior (The Test Guarantee Theorem states three conditions for the detection of a bridging fault by a test vector: A detectable discrepancy must be placed on one of the two bridged nodes, logical feedback must not determine the output of the fault block, and the circuit must be left in a stable state after application of the vector). This approximation is very accurate when the feedback path is short. When the feedback path is long, disallowing oscillation and state-holding behavior is an optimistic assumption that makes the fault easier to diagnose. (Since the MMA theorem requires that potentially detecting vectors be ignored, disallowing potential detections gives us more information to use for diagnosis.)

Before performing the experiment presented in the next section, the original MMA results were replicated on the ISCAS-85 circuits by setting all gate logic thresholds to the same value. As expected, no incorrect diagnoses occurred under these conditions.

(c) Stuck-at signatures.

Since stuck-at signatures are used to create the MMA composite signatures, the diagnostic ability of the technique is limited by the diagnostic ability or quality of the stuck-at signatures. The diagnostic quality of a set of stuck-at signatures, or the test set used to produce them, is often referred to as the diagnostic expectation or diagnostic resolution of the signatures or test set. A test set for which many faults have identical signatures has poor diagnostic resolution, as the likelihood of a precise diagnosis is small. Conversely, if a test set produces a unique signature for each fault, it is considered to have ideal diagnostic resolution. Diagnostic test pattern generators (DTPG) are designed to address this issue, by creating test sets with as high a diagnostic resolution as possible.

Note that the concept of diagnostic resolution is only completely applicable to modeled faults; the connection to unmodeled faults is often tenuous or misleading. For purposes of this research, however, a strong correlation does exist. If composite signatures are used for diagnosis, indistinguishable stuck-at faults will result in indistinguishable bridging faults: if two nodes have identical stuck-at signatures, all corresponding composite signature involving these nodes will also be identical.

For this research, a diagnostic test set was generated by a DTPG system to assure the best possible stuck-at signatures and diagnosis information. The size of the test sets ranged from 60 vectors for the C6288 to 365 vectors for the C7552.

(d) MMA theorem interpretation.

An ambiguity exists in the MMA theory as originally presented. The theory consists of two main elements: a vector that detects a bridging fault will also detect an associated stuck-at fault, and therefore the signature of a bridging fault will be contained in its composite signature. The ambiguity arises because the concept of detection is described in terms of the test vector, but little or nothing is specified about the (error-carrying) circuit outputs.

As described previously, the Byzantine Generals Problem may cause errors to appear on more or fewer circuit outputs than would otherwise be the case; whether more or fewer, the evidence presented by the application of one vector to the faulty circuit will not be identical to O the expected output for any of the four single stuck-at faults associated with the two bridged nodes. Whether or not the faulty signature is contained in the composite signature is a question of the interpretation of the MMA term contained.

A narrow interpretation is that, for each vector, a faulty response is contained in the composite signature only if it is indistinguishable from the response of one of the four stuck-at faults; in other words, every output that is expected to evince an error for the stuck-at fault carries an error for the bridging fault. A broad interpretation is that the faulty response is contained if its affected outputs are a subset of the affected outputs of the four associated stuck-at faults. If the Byzantine Generals Problem were not a factor, the narrow interpretation would always be the superior choice: it strengthens the conditions for matching, thus reducing the number of matches in a diagnosis. However, the narrow interpretation coupled with the Byzantine Generals Problem will cause more incorrect diagnoses.

Example 1 and Example 2 consistently report results using the broad interpretation of containment. After performing experiments using both interpretations on the original MMA technique and the improved technique of the present invention, the results show that the strict interpretation results in, on average, 50% more incorrect diagnoses as with the broad interpretation. On the other hand, the average match sizes with the narrow interpretation are, on average, 60% of the broad-interpretation average match sizes.

The choice was made to use the broad interpretation for two reasons. First, a loss of precision in the matching process was considered acceptable to avoid misleading or incorrect diagnoses; as will subsequently be shown, other improvements made to the technique have improved the precision of the diagnoses greatly without significantly reducing their accuracy. Second, the narrow interpretation assumes that a bridging fault will behave, for a particular detecting vector, exactly or ostensibly as a stuck-at fault; as mentioned previously, this assumption has been shown to be unrealistic and largely unserviceable for successful bridging fault diagnosis.

(e) Baseline results.

This section reports the results from the original technique on the ISCAS-85 circuits. There are three important differences between these experiments and those originally reported by the developers of MMA. First, fault candidates have been limited to only realistic bridging faults, instead of all node pairs. Second, the behaviors diagnosed included the effects of the Byzantine Generals Problem. Third, all circuits reported are much larger than any circuit to which MMA was originally applied.

The diagnoses returned by the MMA technique are frequently unusable because of their size. Table 7 shows the total number of experimental trials, the average number of matches per diagnosis, percentage of diagnoses that are exact, and percentage of diagnoses of size 10 or smaller. It can be seen that the diagnoses returned by the MMA technique range from an average of 33 faults for the C880 to almost 250 faults for the C7552. The average number of faults is less than those reported by Millman, McCluskey, and Acken, even though their circuits were smaller, because the list of candidate faults is limited to realistic faults. Note also that no ordering of candidates is performed by the MMA technique: every fault in these large diagnoses is equally implicated, so no hint is given as to where to begin the physical search for the defect. Table 7 also shows that the number of exact diagnoses is less than 30% for each circuit. Generally, around 50% of the diagnoses are of size ten or less and contain the correct fault. In order for the technique to be useful as a practical diagnostic tool, the percentage of the diagnoses that are small and contain the correct fault must be much larger than that afforded by the basic technique.

Incorrect diagnoses can occur when the bridging faults to be diagnosed are affected by the Byzantine Generals Problem. Table 8 shows the percentage of diagnoses that are incorrect comprised of incomplete, misleading and failed diagnoses. As can be seen from that table, an incorrect diagnosis occurs generally less than 10% of the time. An incorrect diagnosis can be a failed diagnosis, an incomplete diagnosis, or a misleading diagnosis; as shown, the incorrect diagnoses are dominated by failed diagnoses. Incomplete diagnoses are rare, and misleading diagnoses are almost nonexistent. The domination of failed diagnoses in the incorrect diagnoses is an important feature of the MMA technique: when the technique does not provide the right answer, it rarely misleads the user.

Example 2

Superior Results of the Present Invention

The diagnoses returned by the present invention are a substantial improvement over conventional MMA. Table 9 shows the improvement derived from the present invention under strict matching, using only single stuck-at information for match restriction. The total number of experimental trials, average number of matches per diagnosis, percentage of diagnoses that are exact, and percentage of diagnoses that have ten or fewer matches and contain the correct match are shown. As can be seen from that table, for each circuit the size of the average diagnosis is less than one twelfth of its previous value; in some cases the average diagnosis is ninety times smaller than conventional MMA (compare to Table 7). For five of the benchmark circuits, the correct match is part of a small diagnosis (size ten or less) more than ninety percent of the time.

Table 10 shows the percentage of diagnoses that are incorrect, comprised of incomplete, misleading, and failed diagnoses. That table shows that the number of diagnoses that do not contain the correct match has increased by a few percent (compare to Table 8) because of the interaction between the match requirement technique and the Byzantine Generals Problem, but the vast majority of the increase comes from failed diagnoses and not misleading diagnoses. The increased number of failures is more than offset by the increase in usable diagnoses; ultimately, failures can be eliminated by relaxing the matching criteria, results for which will be presented shortly.

As shown in Table 11 and Table 12, the results improve even further if information is included about internal node values from logic simulation when establishing match restrictions. The primary parameter of interest, the size of the average diagnosis, approaches the ideal of 1.0 for most of the circuits. Table 11 shows the total number of experimental trials, the average number of matches per diagnosis, percentage of diagnoses that are exact, and percentage of diagnoses that have ten or fewer matches and contain the correct match. Table 12 shows the percentage of diagnoses that are incorrect, comprises of incomplete, misleading, and failed diagnoses.

As mentioned, ranking the matches and relaxing the matching criteria can both indicate the quality of individual matches, and eliminate failed diagnoses. Table 13 shows these two effects. Shown in Table 13 are the average position of the correct match in non-failed (strict criteria) diagnoses, the number of failed diagnoses recovered and the average position of the correct match in the recovered diagnoses. No Sim and Sim indicate that match restriction was applied without and with logic simulation, respectively. The first and third data columns report the average position of the correct match for diagnoses that did not fail the strict criteria, showing that ranking the matches can further improve the results above by highly-ranking the correct (desired) match. The second and fourth data columns show the effects of relaxing the matching criteria on the failed diagnoses. A failed diagnosis under strict matching criteria is considered recovered if the correct match is included in the d candidates of the relaxed-criteria diagnosis; the Recovered sub-column reports the success rate of this recovery process. The Ave Pos sub-column reports the average rank of the correct match in these recovered diagnoses; again, the ranking is quite successful, ranking the correct match in the top two or three candidates.

Example 3

Results from the experiments of the Example 2 demonstrate the effectiveness of the improved technique of the present invention compared to the original MMA technique. This example reports the results of additional experiments run with the improved technique, in order to gauge the generality of the sampled results.

(a) Diagnosis of other realistic faults.

Example 2 reported the performance of the improved technique on the top 10% most likely bridging faults, as determined by the weighted critical area (WCA) given by Carafe. While this is obviously an interesting set of bridging faults, it is also a biased sample. The question arises: does there exist a relation between the WCA of a fault and its diagnosibility under this technique?

To answer this question, two additional samples were taken of the realistic fault list. First, the least-likely 10% of the faults were simulated and diagnosed. These results are given in Table 14 and Table 15, and should be compared to those in Table 11 and Table 12, respectively.

Second, a random sample of 10% was drawn from the complete fault list, simulated and diagnosed. The use of a random sample is intended to demonstrate the effectiveness of the technique on a cross-section of the realistic faults, without regard to the WCA of the faults. Table 16 gives the first part of the experimental results, and should be compared to Table 11. Table 17 gives the breakdown of diagnosis types for the improved technique on the random sample of realistic faults. The results should be compared to those of Table 12.

The final set of results, regarding the effectiveness of match ranking, for both the least-likely and random samples is given in Table 18. Both sets of results should be compared to the fourth data column of Table 13.

As the results show, there is no significant difference in diagnostic resolution between the three fault samples. While this fails to demonstrate a relation between WCA and diagnosibility, which might have proved useful, it does demonstrate that the improved technique performs equally well regardless of the contents of the fault sample.

Example 4

In order to compare the improved results to standard diagnosis methods, this chapter presents an experiment modeled after the Teradyne fault diagnosis system. The fault ordering method penalizes candidate stuck-at faults for each predicted failure that did not actually occur and for each failure that occurs without being predicted by the candidate. This procedure produces a ranked list of stuck-at faults. Given this ranking, if any of the four stuck-at faults associated with the two bridged nodes appears among the ten highest-ranked faults, the diagnosis is considered a success; otherwise it is counted as a misleading diagnosis. The same observed faulty behaviors used to evaluate the original MMA technique and the improved technique of the present invention were diagnosed for this technique: the top 10% most likely bridging faults.

Table 19 shows the results of fault ordering, and depicts the average position of the first node, average position of the second node, and the percentage of misleading diagnoses. The average position of the first node is in the first ten faults, but the average position of the second node is far behind the first node. The number of diagnoses where neither node appears in the top ten nodes is substantially larger than the number of misleading diagnoses for either the original or improved MMA techniques.

The improved technique of the present invention is better than the fault ordering technique in two respects. First, the improved technique provides the exact two nodes of interest in a set of ten or fewer most of the time. Providing the exact pair is superior to providing individual candidate stuck-at faults: every candidate stuck-at fault represents one node that could be involved with many potential realistic defects. Second, while the improved MMA technique may produce an incorrect diagnoses, an unrecovered incorrect diagnosis occurs less than 4% of the time. All fault ordering diagnoses appear to be the same; there is no way to distinguish a misleading diagnosis from good diagnosis.

4. Additional Considerations.

As shown above, the method of the present invention has proved to be successful on the diagnostic experiments run and reported here. However, a few unresolved issues remain; two important and related issues are refinements in the match rankings and the diagnosis of additional fault types.

4.1 Refining the match rankings.

The match rankings described in Section 3.2 contain a qualitative element, reflected by the lexicographic ordering of the individual components of a match between the observed behavior and a composite signature. Given that a composite signature is a prediction, although admittedly general, of bridging-fault behavior, it should be possible to measure the error between prediction and observation. This error, calculated for each candidate, could then be used to quantitatively rank the candidates, with the best candidate the one having the least prediction error. The question remains, however, whether such an error measurement can made without again resorting to some qualitative components.

The three parts of a composite signature prediction were identified previously: the intersection size, required vector matches, and the number of mispredictions. Each of these can be viewed as an individual prediction; for example, a candidate with three required vectors contains a prediction that the three vectors will be found in the actual fault's behavior.

Section 3.2 presented a method for composing the three prediction errors for candidate match lexicographically. If each component of the prediction is considered an independent Bernoulli trial, these same errors can be normalized and combined arithmetically by using a 1-D Z-statistic to represent each error. A Z-statistic measures how many standard deviations a sample mean X is from its expected value $\mu$; since it is standardized, the differences between the sample mean (observation) and expected value (prediction) for different distributions can be directly compared. The computation of the Z-statistic for prediction error in Bournoulli trials is often formulated as $$Z^2 = \frac{(x-\mu)^2}{\sigma^2} = \frac{(X-pn)^2}{p(1-p)n} \tag{18}$$

where X is the number of successful predictions, p is the probability of success of an individual prediction, and n is the total number of predictions. The statistic is squared to both normalize negative values and emphasize large deviations.

In the composite signature matching process, the primary prediction is the inclusion of all or most of the observed behavior; for this error, X is the size of the intersection, or $|I_i|$, and n is the size of the observed behavior, or $|B|$. For the prediction of required vectors, X is the number of required vectors actually found in the observed behavior: in terms of the notation used earlier, this is $\Re_i|R_i|$; n is then the number of required vectors, or $|R_i|$. For the misprediction error, X is $|I_i|$ and n is $|C_i|$.

Let the probabilities of successful prediction be represented by $p_I$, $p_R$, and $p_M$ for inclusion, required vector, and misprediction, respectively. The total error E, then, for a match of an individual composite signature $C_i$ with an observed faulty behavior B is $$E_i = \frac{(|I_i| - p_I|B|)^2}{p_I|B|(1-p_I)} + \frac{(\Re_i|R_i| - p_R|R_i|)^2}{p_R|R_i|(1-p_R)} + \frac{(|I_i| - p_M|C_i|)^2}{p_M|C_i|(1-p_M)} \tag{19}$$

The error value of Equation (19) would constitute a simple numerical ranking (the candidate with the smallest E is ranked the highest), one that avoided the qualitative aspect of a lexicographic ordering, if it weren't for a glaring omission: proper values for $p_I, p_R$, and $p_M$ are unspecified quantities.

If $p_I$ is the probability of observed behavior inclusion by an accurate prediction (the correct composite signature), then $p_I$ should be close to 1.0. In fact, the original MMA theory would assign this probability a value of 1.0, but as explained previously with regard to the Byzantine Generals Problem, the inclusion of all observed behaviors is unlikely; the results in Example 1 might suggest a value of around 0.90 for $p_I$.

Similarly, $p_R$ is the probability of required vectors actually appearing in the observed faulty behavior. This value is difficult to quantify; at the very least, if the bridging fault behaves according to wired logic (wired-AND or wired-OR), then the required vectors will appear in B. But how often do bridging faults behave in this manner? Perhaps, for the sake of argument, an estimate of 70% could be made, assigning PR the value of 0.70.

Finally, $p_M$ is the probability of misprediction. Assuming wired logic behavior, and that all stuck-at signatures are of roughly equal size, the size of a composite signature could be approximated as twice as large as the size of the fault signature of the bridging fault it describes. In other words, approximately half of the four stuck-at fault behaviors described by a composite signature are expected to actually be observed. The experiments conducted for this research indicate that this estimate is valid for the circuits simulated: after applying match restrictions to remove non-detecting entries, composite signatures are, on average, twice the size of their corresponding bridging fault signatures. This would suggest a value of 0.50 for $p_M$.

Applying the values of 0.90, 0.70, and 0.50 to $p_I$, $p_R$, and $p_M$ would satisfy the requirements of the purely quantitative ranking scheme described above, eliminating the subjectivity of the lexicographic ordering. But these values are simply guesses and approximations, based on little objective evidence. In fact, the rationale behind the qualitative, lexicographic ordering may be more substantial and more honest than the assignment of arbitrary values to these probabilities.

Finally, it is important to note that these three components of the matching process do not exhaust all the sources of information that can be used to judge fault candidates. The most obvious additional parameter is the weighted critical area (WCA) as reported by Carafe, as described previously in connection with inductive fault analysis. The WCA for a fault indicates its relative likelihood of occurrence based upon the physical implementation of the circuit. These relative probabilities could be incorporated into the ranks assigned to each candidate, increasing the information conveyed by the ranking values. Incorporating WCA into the match ranking scheme, as well as some normalized quantitative measurement such as Equation (19) remains a topic for further research.

4.2 Targeting additional fault types.

The diagnostic technique described herein specifically targets defects that can be modeled as bridging faults. While such defects are common and important, other fault types exist and their diagnosis may be as desirable as bridging faults. Among these other fault types are delay faults, open or break faults, and multi-line bridges (involving more than two nodes). In addition, the single defect assumption may be too simplistic for real-world diagnosis. Can the technique be modified to not only handle different fault types, but combinations of these primitive faults as well?

An important component of any such multiple-fault-model diagnosis system is a means of comparing candidates of different fault types. For example, the diagnostic algorithm may consider a fault behavior that appears to involve two circuit nodes as either a bridging fault or two independent stuck-at faults. How can the comparison be performed across such different fault models?

This is exactly where the ranking refinements discussed in the previous section would prove valuable. A purely quantitative measure of confidence in a particular candidate or set of candidates would allow cross-model comparisons, as long as the rankings of different fault models were comparable. In addition, a model-independent measure such as Carafe's WCA could conceivably provide relative probabilities that could be combined with criteria obtained from model-specific assumptions. The proper or most effective balance of this information remains an open, and important, question.

5. Candidate list reduction.

As explained previously, a circuit with n nodes has $$\binom{n}{2}$$

possible bridging faults, thereby making explicit consideration of all such faults infeasible. Accordingly, the present invention further comprises two solutions to the candidate space problem that are tolerant of deviations in expected fault behavior. The first solution, while effective, yields less desirable results than the second solution. The second solution implicitly considers all $$\binom{n}{2}$$

faults and produces an optimal diagnosis, given our ranking criteria, in the absence of physical information.

5.1 Candidate list reduction via stuck-at preselection.

A first method for reducing the candidate space in accordance with the present invention is based on the empirical observation that diagnosis with stuck-at candidates has traditionally proved to be effective in identifying at least one circuit node involved in a bridging fault. Knowing one involved node in a bridging fault reduces the search space: given a set of d candidates for the first node, only dn candidates need be considered.

To produce a bridging fault candidate list from a stuck-at diagnosis, each member of the stuck-at diagnosis is paired with every other node in the circuit. The composite bridging fault signature created for each pair is then compared to the observed behavior, and the top-scoring D bridging fault candidates make up the final diagnosis.

Example 5

We ran a set of experiments on the ISCAS-85 circuits to verify the efficacy of stuck-at diagnosis in identifying one of a pair of bridged nodes. These trials simulated and diagnosed the top 10% of realistic bridging faults (from 160 for the C432 to 5379 for the C7552). Carafe identified the most likely bridging faults, and our fault simulator, Nemesis, simulated them (taking into account the Byzantine Generals Problem for bridging faults). We then ran these simulated bridging fault behaviors through a standard stuck-at fault diagnosis procedure. Different weightings of misprediction and nonprediction penalties were used; Table 20 shows the results from the most successful, equal weightings. The ten candidates with the lowest combined number of mispredictions and nonpredictions constitute the stuck-at diagnosis. Table 20 also shows the percentage of size-ten diagnoses that contain at least one of the two nodes involved in the bridging fault. A stuck-at diagnosis of size ten contains one of the two involved nodes in a bridging fault roughly 90% of the time. It is interesting to note that the second node in the bridging fault is rarely included in the diagnosis.

To produce a bridging fault candidate list from a stuck-at diagnosis, the first diagnosis procedure pairs each member of the stuck-at diagnosis with every other node in the circuit. It then compares the composite bridging fault signature created for each pair to the observed behavior, and the top-scoring D bridging fault candidates make up the final diagnosis. Given an initial stuck-at diagnosis size of d, this procedure reduces the exhaustive list of size $$\binom{n}{2} \text{ by } \binom{n-d}{2},$$

the number of pairs that do not contain at least one node from the stuck-at diagnosis. This means that $$\binom{n}{2} - \binom{n-d}{2} = dn - \frac{d(d+1)}{2} \quad (20)$$

composite signature constructions and comparisons must be performed. Unfortunately, this reduction in candidate-space is achieved at the expense of potential successful diagnoses: the percentage of diagnoses where at least one of the nodes is in the diagnosis, as given in Table 20, sets an upper limit on the eventual success rate of the bridging fault diagnosis. Since only the top d nodes are paired, bridging faults that do not involve one of these nodes will not be considered.

Table 21 shows the result of applying our diagnosis method using a realistic fault list: it gives the number of realistic bridging faults in the candidate fault list, and the percentage of successful diagnoses of size 10 using the realistic candidate list. In contrast, the number of composite signatures produced via stuck-at preselection is generally significantly smaller than the number of realistic faults considered, but stuck-at preselection produces fewer successful diagnoses. Note that for the unsuccessful diagnoses, even increasing the final diagnosis size D to 100 is not often helpful; if one of the two bridged nodes is not included in the original stuck-at preselection, a successful diagnosis can never be performed, regardless of the size of the final diagnosis.

5.2 Candidate list reduction via node preselection with scoring thresholds.

The second method for overcoming the candidate-space problem in accordance with the present invention is based on the observation that diagnosis systems set limits, or thresholds, on the candidates that qualify for the final diagnosis: Either the top-scoring D candidates are included in a diagnosis, or only those candidates that score at or above a threshold $I_t$ are included. In either case, the candidates are sorted by their scores, and only a small number of the intersection with the observed behavior, to be the primary indicator of candidate goodness; the best candidate is the one with the greatest intersection. In the case of intersection ties, we consider the number of required vectors matched and the amount of misprediction, in that order. Because our ordering is lexicographic, we can reduce our scoring criteria to the primary parameter: a candidate with greater containment than another is always ranked higher for a particular diagnosis. Given this fact, it is a simple matter to set a threshold for a diagnosis: either the top D candidates, by size of intersection, are reported, or all candidates that have an intersection greater than or equal to a threshold, $I_t$, make up the diagnosis. Having reduced the scoring to a single primary parameter, there is an opportunity to reduce the candidate search space significantly; if the elements that contribute to this parameter can be reduced to a manageable number. To do this, consider again the construction of a composite bridging fault signature from four stuck-at signatures, as illustrated in FIG. 6. Note that while there are four stuck-at signatures involved, there are only two nodes, each of which can be characterized as the union of its stuck-at-0 and stuck-at-1 structures. We call such a union of the stuck-at-0 and stuck-at-1 signatures for a single node a node signature. A composite bridging fault signature is the union of two node signatures. Note also that while there are $$\binom{n}{2}$$

possible composite bridging fault signatures for an n-node circuit, there are only n node signatures. Using this set of node signatures as a reduced search space, the second procedure attempts to eliminate the vast majority of low-scoring composite bridging fault candidates that could be built from these n nodes.

Consider first the scenario in which a scoring threshold, $I_t$, is set for a diagnosis; this scoring is a minimum acceptable intersection for a composite bridging fault candidate. The key observation behind the second procedure is that for a bridging fault candidate to have an intersection $I_t$ with the observed behavior, one of its component node signatures must have an intersection of at least half of $I_t$. Any possible bridging fault candidate without at least one of its two node signatures scoring at least half of $I_t$ cannot appear in the final diagnosis, and therefore need not be constructed or compared.

In order to produce a bridging fault candidate list, we construct the set of n node signatures, and we perform a diagnosis of the observed behavior in which the intersection of each node candidate is measured. The node candidates are then sorted by this intersection value, and composite bridging fault signatures are constructed only for pairs where the sum of the intersections for the two nodes is at least $I_t$.

As an example, FIG. 7 shows the result of ranking a set of node signatures according to their intersection. If all composite bridging faults in the final diagnosis are required to contain at least 95% of the observed faulty behavior, then the procedure need only consider node pairs where one of the two nodes is from the set comprised of A, B, and C (the set with greater than 47.5% intersection), because no pairing created from the remaining nodes can possibly contain 95% of the observed faulty behavior. Composite bridging fault signatures should be created for the five node pairs A-B, A-C, A-D, B-C, and B-D.

For this method, if there are k node candidates with an intersection of at least half of $I_t$, at most $$\binom{n}{2} - \binom{n-k}{2} = kn - \frac{k(k+1)}{2} \quad (21)$$

This equation is the same as Equation 20 (with all instances of d replaced by k), but unlike Equation 20, this is a loose upper bound, and we expect to actually create many fewer candidates. For the example in FIG. 7, n=6 and k=3 giving a bound of 12, but only 5 composite bridging fault signatures will be created. This procedure guarantees that all composite bridging fault candidates with $I > I_t$ will be constructed. In order to get an idea of the magnitude e of k, and an upper bound on the success rate, we diagnosed the same behaviors from the ISCAS-85 circuits mentioned above, but we used node candidates instead of stuck-at candidates. Instead of a diagnosis size d, a scoring threshold $I_t$ was set, and the average number of qualifying node candidates, or k, was recorded. Table 22 gives results analogous to those presented in Table 20, showing the bound on success rate and average values of k for node preselection with a scoring threshold of $I_t$=95; that is, the percentage of the node diagnoses (for $I_t$=95) that contain at least one of the two bridged nodes. Note that the upper bound for successful diagnosis using this method is much higher than for the previous method.

This approach can be modified to limit the number of composite signatures to at most D candidates. In this case, we proceed in exactly the same fashion, except the value of $I_t$ is dynamic rather than static: it is the current score of the Dth composite bridging fault candidate, or I(D). (Before D candidates have been constructed and scored, assume I(D)= 0). Note that this procedure is guaranteed to produce the same diagnosis, using our scoring criteria, as that we could have achieved via explicitly considering all $$\binom{n}{2}$$

candidates.

Table 23 shows that, as expected, the diagnoses for node preselection with scoring are much more successful than the diagnoses for stuck-at preselection. In particular, the diagnoses of size 100 are very successful. The number of composite signatures created is generally less than or equal to the number of realistic faults created by Carafe for the same circuits.

The most interesting and useful feature of the second method, node preselection with scoring thresholds, is the guarantee it provides about the candidates it considers: Any two-node bridging candidate that can be constructed from the stuck-at fault list that could score at or above a desired threshold will be constructed and scored. This is true despite the fact that many fewer than $$\binom{n}{2}$$

candidates will be constructed and matched.

If the diagnosis algorithm scores the correct candidate above this threshold, we are guaranteed to construct and rank the correct match during the diagnosis. This is not true of the first method of stuck-at preselection, because the initial stuck-at diagnosis may fail to identify one of the bridged nodes. Knowing this, the success rate of the stuck-at preselection method can be projected from the success rate of the node preselection method by the following relation:

$$S_S(D) \approx S_N(D) \cdot S_S(d) \quad (22)$$

where $S_S(D)$ is the success rate of the stuck-at preselection method for a final diagnosis size D, $S_N(D)$ is the success rate of the node preselection method for the same diagnosis size, and $S_S(d)$ is the success rate of the initial stuck-at diagnosis in identifying one of the bridged nodes. Given that node preselection will report all qualifying candidates, two issues remain: what is a proper threshold to set, and what is the proper final diagnosis size? If bridging fault behaviors were perfectly predictable, then the strictest intersection threshold, $I_t$=100 would guarantee consideration of the correct match. Acknowledgment of the Byzantine Generals Problem for bridging faults, non-zero bridge resistance, and the possibility of other sources of noise in the behaviors argue for a lower threshold. For this work $I_t$=95 was chosen as an informed but to arbitrary value; adjustments to this threshold value remain a topic for further research.

The choice of diagnosis size is perhaps more complicated. The results given in Table 23 indicate that the standard choice of 10 candidates may not succeed in all situations. In examining those diagnoses that did not succeed, we found a strong correlation between the number of failing bits (observed errors) in a diagnosed behavior and the success of the diagnosis: the node preselection method performed poorly when the number of failing bits was small for the test set.

Given this fact, it will be appreciated that to maintain a consistent confidence level in the diagnosis results, the number of candidates reported for a given behavior will have to depend upon the number of failing bits, or amount of failure information, available to the diagnosis program. For large diagnosis sizes, then, the diagnosis may be more suitable as a reduced candidate list for further fault discrimination than for actual physical failure analysis. Such further discrimination could include the creation and application of distinguishing test vectors or current measurements, or some probabilistic evaluation such as inductive fault analysis. One final point is that either of our two methods could be used in conjunction with a realistic fault list in order to minimize the number of composite signatures created (the use of node preselection would guarantee no degradation in diagnoses, so it would seem the better choice). This means that these procedures make bridging fault diagnosis feasible for circuits for which there is no physical information, and they make bridging fault diagnosis workable for much larger circuits for which there is a realistic fault list.

The results from the two techniques indicate that the second embodiment is much more successful at reporting the correct match, regardless of the final diagnosis size. In the best case, Pro it can report the correct match in a small number of candidates; in the worst case, it can provide a larger number of candidates, with a high confidence of including the correct match, for possible further discrimination. The performance of the technique appears to depend heavily on the number of failing bits in the behavior to be diagnosed.

Although the description above contains many specificities, these should not be construed as limiting the scope of the invention but as merely providing illustrations of some of the presently preferred embodiments of this invention. Thus the scope of this invention should be determined by the appended claims and their legal equivalents.

TABLE 1

Stuck-At Signatures

| Fault | Vector(s) |
|---|---|
| Asa0 | 2, 4 |
| Asa1 | 1 |
| Bsa0 | 2 |
| Bsa1 | 4, 5 |
| Csa0 | 4 |
| Csa1 | 1, 3 |

TABLE 2

MMA Composite Bridging Fault Signatures

| Fault | Vector(s) |
|---|---|
| A @ B | 1, 2, 4, 5 |
| B @ C | 1, 2, 3, 4, 5 |
| C @ A | 1, 2, 3, 4 |

TABLE 3

Example matches (fault to candidate), and corresponding match types

| Fault | Matching Candidate | Match Type |
|---|---|---|
| X @ Y | X @ Y | Correct |
| X @ Y | X @ Z | Partial |
| X @ Y | W @ Z | Misleading |

TABLE 4

Diagnosis Types

| Fault | Diagnosis (Matching Candidates) | Diagnosis Type |
|---|---|---|
| X @ Y | X @ Y | Exact |
| X @ Y | {X @ Y, X @ Z, W @ Z} | Partial |
| X @ Y | {X @ Z, W @ Z} | Incomplete |
| X @ Y | {W @ Z} | Misleading |
| X @ Y | {} | Failed |

TABLE 5

MMA Composite Bridging Fault Signatures

| Fault | Vector(s) |
|---|---|
| A @ B | 1, 2, 4, 5 |
| B @ C | 1, 2, 3, 4, 5 |
| C @ A | 1, 2, 3, 4 |

TABLE 6

Composite Signatures with Match Restrictions and Match Requirements

| Fault | Vector(s) |
|---|---|
| A @ B | 1, 2, 4, 5 |
| B @ C | 1, 2, 3, 4, 5 |
| C @ A | 1, 2, 3, 4 |

TABLE 7

MMA

| Circuit | Total Trials | Average Matches | Percent Exact | Percent $\leq 10$ |
|---|---|---|---|---|
| C432 | 160 | 66.9 | 11.9% | 29.4% |
| C499 | 279 | 71.1 | 19.4% | 40.1% |
| C880 | 328 | 32.7 | 27.4% | 60.7% |
| C1355 | 443 | 134.2 | 19.6% | 43.8% |
| C1908 | 475 | 168.8 | 16.2% | 32.6% |
| C2670 | 1371 | 232.6 | 12.6% | 40.9% |
| C3540 | 1646 | 53.6 | 27.1% | 55.9% |
| C5315 | 4043 | 102.6 | 29.3% | 66.0% |
| C6288 | 2192 | 93.4 | 18.5% | 33.8% |
| C7522 | 5379 | 248.6 | 17.0% | 47.7% |

TABLE 8

MMA

| Circuit | Incorrect | Incomp | Mislead | Failed |
|---|---|---|---|---|
| C432 | 1.9% | 1.9% | 0% | 0% |
| C499 | 7.9% | 1.4% | 0.4% | 6.1% |
| C880 | 1.2% | 0.6% | 0% | 0.6% |
| C1355 | 2.9% | 0.7% | 0% | 2.3% |
| C1908 | 7.2% | 0.4% | 0.2% | 6.5% |
| C2670 | 9.2% | 2.4% | 0.1% | 6.6% |
| C3540 | 7.7% | 1.8% | 0.2% | 5.7% |
| C5315 | 5.9% | 1.6% | 0.2% | 4.1% |
| C6288 | 4.5% | 1.0% | 0.3% | 3.2% |
| C7522 | 10.5% | 3.3% | 0.6% | 6.5% |

TABLE 9

Present Invention Under Strict Matching

| Circuit | Total Trails | Average Matches | Percent Exact | Percent $\leq 10$ |
|---|---|---|---|---|
| C432 | 160 | 3.4 | 48.8% | 96.8% |
| C499 | 279 | 1.3 | 74.9% | 90.3% |
| C880 | 328 | 1.3 | 82.0% | 93.9% |
| C1355 | 443 | 1.6 | 75.6% | 95.5% |
| C1908 | 475 | 7.5 | 54.3% | 84.9% |
| C2670 | 1371 | 10.4 | 53.6% | 84.8% |
| C3540 | 1646 | 3.4 | 62.3% | 85.6% |
| C5315 | 4043 | 4.5 | 72.7% | 83.1% |
| C6288 | 2192 | 1.0 | 86.7% | 90.0% |
| C7522 | 5379 | 10.5 | 55.2% | 72.1% |

TABLE 10

Present Invention Under Strict Matching, Using Only Single Stuck-At Information for Match Restriction

| Circuit | Incorrect | Incomp | Mislead | Failed |
|---|---|---|---|---|
| C432 | 2.5% | 0.6% | 0% | 1.9% |
| C499 | 9.7% | 0% | 0% | 9.7% |
| C880 | 6.1% | 1.2% | 0.6% | 4.3% |
| C1355 | 3.4% | 0% | 0% | 3.4% |
| C1908 | 8.0% | 1.3% | 0% | 6.7% |
| C2670 | 11.9% | 1.1% | 0.7% | 10.1% |
| C3540 | 10.8% | 0.5% | 0.4% | 9.9% |
| C5315 | 12.2% | 0.4% | 0.2% | 11.5% |
| C6288 | 9.8% | 0% | 0% | 9.8% |
| C7522 | 17.1% | 0.9% | 0.7% | 15.4% |

TABLE 11

Present Invention Under Strict Matching, Using Logic Simulation for Match Restriction

| Circuit | Total Trials | Average Matches | Percent Exact | Percent $\leq 10$ |
|---|---|---|---|---|
| C432 | 160 | 1.8 | 76.3% | 93.8% |
| C499 | 279 | 1.1 | 84.2% | 90.3% |
| C880 | 328 | 1.1 | 89.3% | 93.3% |
| C1355 | 443 | 1.3 | 86.5% | 95.5% |
| C1908 | 475 | 3.5 | 67.4% | 85.1% |
| C2670 | 1371 | 7.0 | 62.4% | 78.3% |
| C3540 | 1646 | 1.3 | 79.4% | 87.9% |
| C5315 | 4043 | 1.1 | 82.2% | 87.5% |
| C6288 | 2192 | 1.0 | 87.3% | 90.2% |
| C7522 | 5379 | 2.4 | 67.4% | 79.7% |

TABLE 12

Present Invention Under Strict Matching,
Using Logic Simulation for Match Restriction

| Circuit | Incorrect | Incomp | Mislead | Failed |
|---|---|---|---|---|
| C432 | 2.5% | 0.6% | 0% | 1.9% |
| C499 | 9.7% | 0% | 0% | 9.7% |
| C880 | 6.1% | 0.3% | 0.6% | 5.2% |
| C1355 | 3.4% | 0% | 0% | 3.4% |
| C1908 | 8.9% | 0.4% | 0.4% | 8.0% |
| C2670 | 12.3% | 0.5% | 0.7% | 11.0% |
| C3540 | 11.2% | 0.1% | 0.1% | 10.9% |
| C5315 | 12.0% | 0% | 0% | 12.0% |
| C6288 | 9.8% | 0% | 0% | 9.8% |
| C7522 | 16.6% | 0.3% | 0.4% | 15.9% |

TABLE 13

Effects of Rank Matching,
and Relaxing Match Criteria for Failed Diagnoses

| | Non-Failed, No Sim | Failed, No Sim | | Non-Failed, With Sim | Failed, With Sim | |
|---|---|---|---|---|---|---|
| | Sim Ave Pos | Recovered Pos | Ave | Sim Ave Pos | Recovered Pos | Ave |
| C432 | 1.9 | 2/3 | 1.2 | 4.0 | 3/3 | 2.3 |
| C499 | 1.0 | 27/27 | 1.0 | 1.9 | 27/27 | 1.5 |
| C880 | 1,1 | 13/14 | 1.0 | 1.2 | 17/17 | 1.5 |
| C1355 | 1.4 | 15/15 | 1.2 | 1.1 | 15/15 | 1.1 |
| C1908 | 3.1 | 28/32 | 1.4 | 1.5 | 32/35 | 1.3 |
| C2670 | 2.3 | 136/139 | 1.4 | 1.2 | 142/144 | 1.2 |
| C3540 | 2.2 | 157/163 | 1.1 | 1.6 | 173/175 | 1.4 |
| C5315 | 3.2 | 440/466 | 1.0 | 1.4 | 474/482 | 1.1 |
| C6288 | 1.0 | 210/214 | 1.0 | 1.3 | 211/215 | 1.3 |
| C7522 | 6.0 | 732/826 | 1.6 | 1.4 | 806/856 | 1.4 |

TABLE 14

Present Invention, Diagnosing Least-Likely 10% of Bridging Faults,
With Strict Matching and Logic Simulation for Match Restrictions

| Circuit | Total Trials | Average Matches | Percent Exact | Percent ≤10 |
|---|---|---|---|---|
| C432 | 159 | 2.6 | 66.7% | 94.3% |
| C499 | 278 | 1.3 | 82.7% | 93.9% |
| C880 | 327 | 1.1 | 88.7% | 90.8% |
| C1355 | 442 | 1.1 | 91.0% | 99.1% |
| C1908 | 474 | 3.0 | 76.2% | 95.8% |
| C2670 | 1371 | 1.5 | 86.5% | 98.3% |
| C3540 | 1645 | 1.4 | 69.2% | 84.4% |
| C5315 | 4043 | 1.2 | 74.8% | 88.0% |
| C6288 | 2192 | 1.0 | 87.6% | 88.9% |
| C7522 | 5378 | 1.5 | 77.2% | 89.2% |

TABLE 15

Present Invention, Diagnosing Least-Likely 10% of Bridging Faults,
With Strict Matching and Logic Simulation for Match Restrictions

| Circuit | Incorrect | Incomp | Mislead | Failed |
|---|---|---|---|---|
| C432 | 1.9% | 0% | 0.6% | 1.3% |
| C499 | 6.0% | 0.4% | 0% | 5.6% |
| C880 | 9.2% | 0% | 0.3% | 8.9% |
| C1355 | 0.9% | 0% | 0% | 0.9% |
| C1908 | 3.8% | 0% | 0% | 3.8% |
| C2670 | 1.5% | 0% | 0.1% | 1.5% |
| C3540 | 15.3% | 0% | 0.2% | 15.1% |
| C5315 | 12.0% | 0% | 0% | 12.0% |
| C6288 | 9.8% | 0% | 0% | 9.8% |
| C7522 | 10.7% | 0.1% | 0.2% | 10.4% |

TABLE 16

Present Invention, Diagnosing Random Sample of 10% of Bridging Faults,
With Strict Matching and Logic Simulation for Match Restrictions

| Circuit | Total Trials | Average Matches | Percent Exact | Percent ≤10 |
|---|---|---|---|---|
| C432 | 159 | 2.2 | 69.8% | 96.8% |
| C499 | 270 | 1.2 | 83.7% | 91.5% |
| C880 | 316 | 1.1 | 88.0% | 92.4% |
| C1355 | 419 | 1.3 | 86.9% | *93.3% |
| C1908 | 448 | 3.2 | 67.9% | 92.8% |
| C2670 | 1355 | 4.7 | 68.9% | 88.1% |
| C3540 | 1641 | 1.5 | 77.2% | 87.6% |
| C5315 | 4064 | 1.1 | 82.6% | 87.8% |
| C6288 | 2223 | 1.0 | 85.6% | 88.7% |
| C7522 | 5381 | 2.0 | 71.81% | 83.3% |

TABLE 17

Present Invention, Diagnosing Random Sample of 10% of Bridging Faults,
With Strict Matching and Logic Simulation for Match Restrictions

| Circuit | Incorrect | Incomp | Mislead | Failed |
|---|---|---|---|---|
| C432 | 1.9% | 0.6% | 0% | 1.3% |
| C499 | 8.5% | 0% | 0% | 8.5% |
| C880 | 7.6% | 0% | 0% | 7.6% |
| C1355 | 5.7% | 0% | 0% | 5.7% |
| C1908 | 6.2% | 0% | 0.2% | 6.0% |
| C2670 | 11.3% | 0.2% | 1.0% | 10.1% |
| C3540 | 12.2% | 0.1% | 0% | 12.1% |
| C5315 | 12.2% | 0% | 0% | 12.2% |
| C6288 | 11.3% | 0% | 0% | 11.3% |
| C7522 | 16.2% | 0.1% | 0.3% | 15.8% |

TABLE 18

Effects of Match Ranking, and Relaxing Match Criteria for Failed
Diagnoses, On Different Samples of Faulty Behavior

| | Non-Failed, Least-likely Ave Pos | Failed, Least-likely Recovered Pos | Ave | Failed, Random Ave Pos | Failed, Random Recovered Pos | Ave |
|---|---|---|---|---|---|---|
| C432 | 1.8 | 2/2 | 1.5 | 1.0 | 1/2 | 1.0 |
| C499 | 1.0 | 16/16 | 1.0 | 2.4 | 23/23 | 1.4 |
| C880 | 1.0 | 28/29 | 1.0 | 1.2 | 24/24 | 1.4 |
| C1355 | 1.0 | 4/4 | 1.2 | 1.5 | 24/24 | 1.0 |
| C1908 | 1.4 | 18/18 | 1.3 | 1.1 | 26/27 | 1.6 |
| C2670 | 1.0 | 20/21 | 1.2 | 1.2 | 136/137 | 1.1 |
| C3540 | 1.2 | 245/249 | 1.1 | 1.4 | 196/199 | 1.3 |
| C5315 | 1.0 | 467/482 | 1.0 | 1.2 | 486/495 | 1.1 |
| C6288 | 1.0 | 235/243 | 1.0 | 1.2 | 249/252 | 1.4 |
| C7522 | 1.1 | 542/559 | 1.2 | 1.2 | 810/852 | 1.4 |

TABLE 19

Fault Ordering

| Circuit | Avg N1 position | Avg N2 position | Misleading Diagnoses |
|---|---|---|---|
| C432 | 2.1 | 48.2 | 0.6% |
| C499 | 2.9 | 44.8 | 5.4% |
| C880 | 1.6 | 34.6 | 0% |
| C1355 | 5.0 | 92.8 | 9.0% |
| C1908 | 1.9 | 77.0 | 1.3% |
| C2670 | 3.5 | 94.7 | 6.6% |
| C3540 | 1.6 | 102.3 | 0.6% |
| C5315 | 1.5 | 52.8 | 0.8% |
| C6288 | 5.8 | 228.0 | 14.4% |
| C7522 | 2.2 | 107.8 | 3.0% |

TABLE 20

Stuck-At Diagnosis on Bridging Fault Behavior (d = 10)

| Circuit | Success |
|---|---|
| C432 | 98.1 |
| C499 | 83.9 |
| C880 | 98.8 |
| C1355 | 83.8 |
| C1908 | 92.1 |
| C2670 | 96.0 |
| C3540 | 99.5 |
| C5315 | 97.8 |
| C6288 | 88.4 |
| C7552 | 94.1 |

TABLE 21

Realistic List / Stuck-at Preselection

| | Realistic List | | Stuck-at Preselection | | |
|---|---|---|---|---|---|
| Circuit | Comp. Sigs. | % Success (D = 10) | Comp. Sigs. | % Success (D = 10) | % Success (D = 100) |
| C432 | 1,595 | 98.1 | 1,615 | 74.7 | 97.5 |
| C499 | 2,781 | 100.0 | 2,145 | 83.9 | 83.9 |
| C880 | 3,275 | 98.8 | 2,665 | 95.4 | 98.2 |
| C1355 | 4,422 | 98.9 | 4,005 | 82.9 | 83.1 |
| C1908 | 4,744 | 91.2 | 3,335 | 75.2 | 89.2 |
| C2670 | 13,710 | 94.8 | 6,885 | 81.8 | 92.5 |
| C3540 | 16,459 | 96.2 | 7,655 | 89.0 | 96.0 |
| C5315 | 40,430 | 97.7 | 13,175 | 97.0 | 97.0 |
| C6288 | 21,911 | 99.8 | 18,715 | 88.4 | 88.4 |
| C7552 | 53,789 | 94.7 | 16,800 | 83.0 | 89.0 |

TABLE 22

Bound on Success Rates and Average Values of k for Node Preselection ($I_t$ = 95)

| | Node $I_t$ = 95 | |
|---|---|---|
| Circuit | Success Bound | k |
| C432 | 100.0 | 15.0 |
| C499 | 100.0 | 41.2 |
| C880 | 100.0 | 8.6 |
| C1355 | 100.0 | 102.5 |
| C1908 | 99.6 | 31.0 |
| C2670 | 99.9 | 26.0 |
| C3540 | 100.0 | 26.1 |
| C5315 | 99.9 | 9.2 |
| C6288 | 99.7 | 79.1 |
| C7552 | 99.5 | 16.2 |

TABLE 23

Composite Signatures and Successful Node Preselection Diagnoses

| | Node Preselection | | | |
|---|---|---|---|---|
| Circuit | Comp. Sigs (D = 10) | % Success | Comp. Sigs (D = 100) | % Success |
| C432 | 879 | 76.0 | 1,117 | 99.4 |
| C499 | 4,162 | 97.5 | 4,268 | 99.4 |
| C880 | 624 | 96.0 | 1,042 | 98.8 |
| C1355 | 17,529 | 98.9 | 21,035 | 99.2 |
| C1908 | 3,518 | 79.6 | 4,573 | 96.8 |
| C2670 | 5,085 | 83.1 | 6,611 | 96.4 |
| C3540 | 3,281 | 89.0 | 4,271 | 96.2 |
| C5315 | 2,489 | 97.0 | 3,302 | 97.7 |
| C6288 | 33,603 | 99.7 | 40,324 | 99.7 |
| C7552 | 4,537 | 84.0 | 5,211 | 94.7 |

What is claimed is:

1. A method of bridging fault diagnosis of an integrated circuit for identifying a first circuit node shorted to a second circuit node, said first circuit node shorted to said second circuit node defining a pair of bridged circuit nodes, said method comprising the steps of:

(a) establishing a composite signature for each fault in a plurality of faults;

(b) imposing a match restriction to each composite signature to reduce the size of the composite signature and to reduce the number of composite signatures that are consistent with the observed output;

(c) imposing a match requirement to each composite signature to reduce the number of composite signatures that are consistent with the observed output; and (d) ranking the composite signatures that are consistent with the observed output in relation to their correlation with the observed output.

2. A method as recited in claim 1, further comprising the step of restricting the establishment of composite signatures to realistic faults.

3. A method as recited in claim 2, wherein said composite signatures are restricted to realistic faults through inductive fault analysis.

4. A method as recited in claim 1, wherein said match restriction step comprises removing vectors from said composite signatures that place identical logical values on bridged circuit nodes.

5. A method as recited in claim 1, wherein a composite signature is established by taking the union of the signatures for each of the two nodes stuck at logical value zero and stuck at logical value one and wherein said match requirement step comprises identifying vectors in said composite signatures for each of two circuit nodes that place opposite logical values on bridged circuit nodes and designating said vectors as requiring a match.

6. A method as recited in claim 1, wherein said step of ranking said composite signatures comprises ranking candidates for said composite signatures as a function of a nonprediction index.

7. A method as recited in claim 6, wherein said step of ranking said composite signatures comprises constructing a diagnosis of a specified number of highest-ranked candidates for said composite signatures.

8. A method as recited in claim 1, further comprising the step of:

(e) ranking the composite signatures that are consistent with the observed output in relation to their correction with the observed output without explicitly considering all pairs of bridged circuit nodes.

9. A method of bridging fault diagnosis of an integrated circuit for identifying a first circuit node shorted to a second circuit node, said first circuit node shorted to said second circuit node defining a pair of bridged circuit nodes, said method comprising the steps of:

(a) establishing a composite signature for each fault in a plurality of faults;

(b) restricting the establishment of composite signatures to realistic faults;

(c) imposing a match restriction to each composite signature to reduce the size of the composite signature and to reduce the number of composite signatures that are consistent with the observed output and imposing a match requirement to reduce the number of composite signatures that are consistent with the observed output; and (d) ranking the composite signatures that are consistent with the observed output in relation to their correlation with the observed output without explicitly considering all pairs of bridged circuit nodes.

10. A method as recited in claim 9, wherein said composite signatures are restricted to realistic faults through inductive fault analysis.

11. A method as recited in claim 9, wherein said match restriction and requirement steps comprise:

(a) removing vectors from said composite signatures that place identical logical values on bridged circuit nodes; and (b) identifying vectors in said composite signatures for each of two circuit nodes that place opposite logical values on bridged circuit nodes and designating said vectors as requiring a match.

12. A method as recited in claim 9, wherein said step of ranking the composite signatures that are consistent with the observed output in relation to their correlation with the observed output without explicitly considering all pairs of bridged circuit nodes comprises the steps of:

(a) ranking candidates for said composite signatures as a function of a nonprediction index; and (b) constructing a diagnosis of a specified number of highest-ranked candidates for said composite signatures.

13. A method of bridging fault diagnosis of an integrated circuit for identifying a first circuit node shorted to a second circuit node, said first circuit node shorted to said second circuit node defining a pair of bridged circuit nodes, said method comprising the steps of:

(a) establishing a composite signature for each fault in a plurality of faults;

(b) restricting the establishment of said composite signatures to realistic faults though inductive fault analysis;

(c) removing vectors from said composite signatures that place identical logical values on bridged circuit nodes;

(d) identifying vectors in said composite signatures for each of two circuit nodes that place opposite logical values on bridged circuit nodes and designating said vectors as requiring a match; and (e) ranking the composite signatures that are consistent with the observed output in relation to their correlation with the observed output without explicitly considering all pairs of bridged circuit nodes.

14. A method as recited in claim 13, wherein said step of ranking the composite signatures that are consistent with the observed output in relation to their correlation with the observed output comprises the steps of:

(a) ranking candidates for said composite signatures as a function of a nonprediction index; and (b) constructing a diagnosis of a specified number of highest-ranked candidates for said composite signatures.

15. A method of bridging fault diagnosis of an integrated circuit for identifying a first circuit node shorted to a second circuit node, said first circuit node shorted to said second circuit node defining a pair of bridged circuit nodes, said method comprising the steps of:

(a) establishing a composite signature for each fault in a plurality of faults;

(b) restricting the establishment of said composite signatures to realistic faults though inductive fault analysis;

(c) removing vectors from said composite signatures that place identical logical values on bridged circuit nodes;

(d) identifying vectors in said composite signatures for each of two circuit nodes that place opposite logical values on bridged nodes and designating said vectors as requiring a match;

(e) ranking the composite signatures that are consistent with the observed output in relation to their correlation with the observed output;

(f) ranking candidates for said composite signatures as a function of a nonprediction index;

(g) constructing a diagnosis of a specified number of highest-ranked candidates for said composite signatures; and (h) ranking said highest-ranked candidates for said composite signatures without explicitly considering all pairs of bridged circuit nodes.

* * * * *